(12) United States Patent
Li et al.

(10) Patent No.: US 9,508,890 B2
(45) Date of Patent: Nov. 29, 2016

(54) PHOTOVOLTAICS ON SILICON

(75) Inventors: Jizhong Li, Bordentown, NJ (US);
Anthony J. Lochtefeld, Ipswich, MA (US); Calvin Sheen, Derry, NH (US); Zhiyuan Cheng, Lincoln, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 287 days.

(21) Appl. No.: 12/100,131

(22) Filed: Apr. 9, 2008

(65) Prior Publication Data
US 2008/0257409 A1    Oct. 23, 2008

Related U.S. Application Data

(60) Provisional application No. 60/922,533, filed on Apr. 9, 2007.

(51) Int. Cl.
*H01L 31/00* (2006.01)
*H01L 31/18* (2006.01)
*H01L 31/0693* (2012.01)

(52) U.S. Cl.
CPC ....... *H01L 31/1852* (2013.01); *H01L 31/0693* (2013.01); *Y02E 10/544* (2013.01); *Y02P 70/521* (2015.11)

(58) Field of Classification Search
CPC .......... H01L 31/036; H01L 31/03044; H01L 31/0304; H01L 21/02647; H01L 21/02381; H01L 31/1852; H01L 31/0693; Y02P 70/521; Y02E 10/544
USPC ....................................................... 136/259
See application file for complete search history.

(56) References Cited

U.S. PATENT DOCUMENTS

| | | | |
|---|---|---|---|
| 4,322,253 A | | 3/1982 | Pankove et al. |
| 4,370,510 A | * | 1/1983 | Stirn ............................ 136/262 |
| 4,522,661 A | * | 6/1985 | Morrison et al. ............ 148/33.2 |
| 4,545,109 A | | 10/1985 | Reichert |
| 4,551,394 A | | 11/1985 | Betsch et al. |
| 4,651,179 A | | 3/1987 | Reichert |
| 4,727,047 A | | 2/1988 | Bozler et al. |
| 4,774,205 A | | 9/1988 | Choi et al. |
| 4,789,643 A | | 12/1988 | Kajikawa et al. |
| 4,826,784 A | | 5/1989 | Salerno et al. |
| 4,860,081 A | | 8/1989 | Cogan |
| 4,876,210 A | * | 10/1989 | Barnett ............. H01L 21/02381 117/58 |

(Continued)

FOREIGN PATENT DOCUMENTS

| | | |
|---|---|---|
| CN | 2550906 | 5/2003 |
| DE | 10017137 | 10/2000 |

(Continued)

OTHER PUBLICATIONS

Li et al. ("Selective Growth of Ge on Si(100) through vias of SiO2 nanotemplate using solid source molecular beam epitaxy"), Applied Physics Letters, vol. 83 (24) p. 5032-5034, Dec. 2003.*
Tomiya, "Dependency of crystallographic tilt and defect distribution on mask material in epitaxial lateral overgrown GaN layers" Applied Physics Letters vol. 77, No. 5, pp. 636-638.*
International Preliminary Report on Patentability for International Application No. PCT/US2007/019568, mailed Mar. 10, 2009 (7 pages).

(Continued)

*Primary Examiner* — Devina Pillay
(74) *Attorney, Agent, or Firm* — Slater Matsil, LLP

(57) ABSTRACT

Structures including crystalline material disposed in openings defined in a non-crystalline mask layer disposed over a substrate. A photovoltaic cell may be disposed above the crystalline material.

25 Claims, 17 Drawing Sheets

(56) References Cited

U.S. PATENT DOCUMENTS

| | | | |
|---|---|---|---|
| 4,948,456 | A | 8/1990 | Schubert |
| 4,963,508 | A * | 10/1990 | Umeno et al. ............... 117/90 |
| 5,032,893 | A | 7/1991 | Fitzgerald, Jr. et al. |
| 5,034,337 | A | 7/1991 | Mosher et al. |
| 5,061,644 | A | 10/1991 | Yue et al. |
| 5,079,616 | A | 1/1992 | Yacobi et al. |
| 5,091,333 | A | 2/1992 | Fan et al. |
| 5,091,767 | A | 2/1992 | Bean et al. |
| 5,093,699 | A | 3/1992 | Weichold et al. |
| 5,098,850 | A | 3/1992 | Nishida et al. |
| 5,105,247 | A | 4/1992 | Cavanaugh |
| 5,108,947 | A | 4/1992 | Demeester et al. |
| 5,156,995 | A | 10/1992 | Fitzgerald, Jr. et al. |
| 5,159,413 | A | 10/1992 | Calviello et al. |
| 5,164,359 | A | 11/1992 | Calviello et al. |
| 5,166,767 | A | 11/1992 | Kapoor et al. |
| 5,223,043 | A | 6/1993 | Olson et al. |
| 5,236,546 | A | 8/1993 | Mizutani et al. |
| 5,238,869 | A | 8/1993 | Shichijo et al. |
| 5,256,594 | A | 10/1993 | Wu et al. |
| 5,269,852 | A | 12/1993 | Nishida |
| 5,269,876 | A | 12/1993 | Mizutani et al. |
| 5,272,105 | A | 12/1993 | Yacobi et al. |
| 5,281,283 | A | 1/1994 | Tokunaga et al. |
| 5,285,086 | A | 2/1994 | Fitzgerald, Jr. |
| 5,295,150 | A | 3/1994 | Vangieson et al. |
| 5,356,831 | A | 10/1994 | Calviello et al. |
| 5,403,751 | A | 4/1995 | Nishida et al. |
| 5,405,453 | A | 4/1995 | Ho et al. |
| 5,407,491 | A | 4/1995 | Freundlich et al. |
| 5,410,167 | A | 4/1995 | Saito |
| 5,417,180 | A | 5/1995 | Nakamura et al. |
| 5,427,976 | A | 6/1995 | Koh et al. |
| 5,432,120 | A | 7/1995 | Meister et al. |
| 5,438,018 | A | 8/1995 | Mori et al. |
| 5,461,243 | A | 10/1995 | Ek et al. |
| 5,518,953 | A | 5/1996 | Takasu et al. |
| 5,528,209 | A | 6/1996 | MacDonald et al. |
| 5,545,586 | A | 8/1996 | Koh |
| 5,548,129 | A | 8/1996 | Kubena |
| 5,589,696 | A | 12/1996 | Baba et al. |
| 5,621,227 | A | 4/1997 | Joshi |
| 5,622,891 | A | 4/1997 | Saito |
| 5,640,022 | A | 6/1997 | Inai et al. |
| 5,710,436 | A | 1/1998 | Tanamoto et al. |
| 5,717,709 | A | 2/1998 | Sasaki et al. |
| 5,767,507 | A * | 6/1998 | Unlu et al. ............... 369/120 |
| 5,792,679 | A | 8/1998 | Nakato |
| 5,825,049 | A | 10/1998 | Simmons et al. |
| 5,825,240 | A | 10/1998 | Geis et al. |
| 5,849,077 | A | 12/1998 | Kenney |
| 5,853,497 | A | 12/1998 | Lillington et al. |
| 5,869,845 | A | 2/1999 | Vander Wagt et al. |
| 5,883,549 | A | 3/1999 | De Los Santos |
| 5,886,385 | A | 3/1999 | Arisumi et al. |
| 5,903,170 | A | 5/1999 | Kulkarni et al. |
| 5,953,361 | A | 9/1999 | Borchert et al. |
| 5,959,308 | A | 9/1999 | Shichijo et al. |
| 5,966,620 | A | 10/1999 | Sakaguchi et al. |
| 5,998,781 | A | 12/1999 | Vawter et al. |
| 6,011,271 | A | 1/2000 | Sakuma et al. |
| 6,015,979 | A | 1/2000 | Sugiura et al. |
| 6,049,098 | A | 4/2000 | Sato et al. |
| 6,083,598 | A | 7/2000 | Ohkubo et al. |
| 6,100,106 | A | 8/2000 | Yamaguchi et al. |
| 6,110,813 | A | 8/2000 | Ota et al. |
| 6,111,288 | A | 8/2000 | Watanabe et al. |
| 6,121,121 | A * | 9/2000 | Koide ............... H01L 21/0237 257/E21.112 |
| 6,121,542 | A | 9/2000 | Shiotsuka et al. |
| 6,150,242 | A | 11/2000 | Van der Wagt et al. |
| 6,153,010 | A | 11/2000 | Kiyoku et al. |
| 6,191,432 | B1 | 2/2001 | Sugiyama et al. |
| 6,225,650 | B1 | 5/2001 | Tadatomo et al. |
| 6,228,691 | B1 | 5/2001 | Doyle |
| 6,229,153 | B1 | 5/2001 | Botez et al. |
| 6,235,547 | B1 | 5/2001 | Sakuma et al. |
| 6,252,261 | B1 | 6/2001 | Usui et al. |
| 6,252,287 | B1 | 6/2001 | Kurtz et al. |
| 6,271,551 | B1 | 8/2001 | Schmitz et al. |
| 6,274,889 | B1 | 8/2001 | Ota et al. |
| 6,300,650 | B1 * | 10/2001 | Sato ............... 257/184 |
| 6,320,220 | B1 | 11/2001 | Watanabe et al. |
| 6,325,850 | B1 | 12/2001 | Beaumont et al. |
| 6,339,232 | B1 | 1/2002 | Takagi |
| 6,340,788 | B1 * | 1/2002 | King ............... H01J 37/3023 136/255 |
| 6,342,404 | B1 | 1/2002 | Shibata et al. |
| 6,348,096 | B1 | 2/2002 | Sunakawa et al. |
| 6,352,942 | B1 | 3/2002 | Luan et al. |
| 6,362,071 | B1 | 3/2002 | Nguyen et al. |
| 6,380,051 | B1 | 4/2002 | Yuasa et al. |
| 6,380,590 | B1 | 4/2002 | Yu |
| 6,403,451 | B1 | 6/2002 | Linthicum et al. |
| 6,407,425 | B1 | 6/2002 | Babcock et al. |
| 6,456,214 | B1 | 9/2002 | van der Wagt |
| 6,458,614 | B1 | 10/2002 | Nanishi et al. |
| 6,475,869 | B1 | 11/2002 | Yu |
| 6,492,216 | B1 | 12/2002 | Yeo et al. |
| 6,500,257 | B1 | 12/2002 | Wang et al. |
| 6,503,610 | B2 | 1/2003 | Hiramatsu et al. |
| 6,512,252 | B1 | 1/2003 | Takagi et al. |
| 6,521,514 | B1 | 2/2003 | Gehrke et al. |
| 6,552,259 | B1 | 4/2003 | Hosomi et al. |
| 6,566,284 | B2 | 5/2003 | Thomas, III et al. |
| 6,576,532 | B1 | 6/2003 | Jones et al. |
| 6,579,463 | B1 | 6/2003 | Winningham et al. |
| 6,603,172 | B1 | 8/2003 | Segawa et al. |
| 6,606,335 | B1 | 8/2003 | Kuramata et al. |
| 6,617,643 | B1 | 9/2003 | Goodwin-Johansson |
| 6,635,110 | B1 | 10/2003 | Luan et al. |
| 6,645,295 | B1 | 11/2003 | Koike et al. |
| 6,645,797 | B1 | 11/2003 | Buynoski et al. |
| 6,686,245 | B1 | 2/2004 | Mathew et al. |
| 6,703,253 | B2 | 3/2004 | Koide |
| 6,709,982 | B1 | 3/2004 | Buynoski et al. |
| 6,710,368 | B2 | 3/2004 | Fisher et al. |
| 6,720,196 | B2 | 4/2004 | Kunisato et al. |
| 6,727,523 | B2 | 4/2004 | Morita et al. |
| 6,753,555 | B2 | 6/2004 | Takagi et al. |
| 6,756,611 | B2 | 6/2004 | Kiyoku et al. |
| 6,762,483 | B1 | 7/2004 | Krivokapic et al. |
| 6,767,793 | B2 | 7/2004 | Clark et al. |
| 6,784,074 | B2 | 8/2004 | Shchukin et al. |
| 6,787,864 | B2 | 9/2004 | Paton et al. |
| 6,794,718 | B2 | 9/2004 | Nowak et al. |
| 6,800,910 | B2 | 10/2004 | Lin et al. |
| 6,803,598 | B1 | 10/2004 | Berger et al. |
| 6,809,351 | B2 | 10/2004 | Kuramoto et al. |
| 6,812,053 | B1 | 11/2004 | Kong et al. |
| 6,812,495 | B2 | 11/2004 | Wada et al. |
| 6,815,241 | B2 | 11/2004 | Wang |
| 6,815,738 | B2 | 11/2004 | Rim |
| 6,825,534 | B2 | 11/2004 | Chen et al. |
| 6,831,350 | B1 | 12/2004 | Liu et al. |
| 6,835,246 | B2 | 12/2004 | Zaidi |
| 6,835,618 | B1 | 12/2004 | Dakshina-Murthy et al. |
| 6,838,322 | B2 | 1/2005 | Pham et al. |
| 6,841,410 | B2 | 1/2005 | Sasaoka et al. |
| 6,841,808 | B2 | 1/2005 | Shibata et al. |
| 6,849,077 | B2 | 2/2005 | Ricci |
| 6,849,487 | B2 | 2/2005 | Taylor, Jr. et al. |
| 6,849,884 | B2 | 2/2005 | Clark et al. |
| 6,855,583 | B1 | 2/2005 | Krivokapic et al. |
| 6,855,982 | B1 | 2/2005 | Xiang et al. |
| 6,855,990 | B2 | 2/2005 | Yeo et al. |
| 6,867,433 | B2 | 3/2005 | Yeo et al. |
| 6,873,009 | B2 | 3/2005 | Hisamoto et al. |
| 6,882,051 | B2 | 4/2005 | Majumdar et al. |
| 6,887,773 | B2 | 5/2005 | Gunn, III et al. |
| 6,888,181 | B1 | 5/2005 | Liao et al. |
| 6,900,070 | B2 | 5/2005 | Craven et al. |
| 6,900,502 | B2 | 5/2005 | Ge et al. |
| 6,902,965 | B2 | 6/2005 | Ge et al. |

(56) References Cited

U.S. PATENT DOCUMENTS

| | | |
|---|---|---|
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert et al. |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green et al. |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda et al. |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,148,417 B1* | 12/2006 | Landis ............... H01L 31/0725 136/261 |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1* | 3/2004 | Chao ................... H04N 5/3575 348/308 |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1* | 6/2004 | Walukiewicz ...... H01L 31/0687 136/262 |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |

(56) References Cited

U.S. PATENT DOCUMENTS

| | | |
|---|---|---|
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1* | 9/2005 | Bianchi ............ H01L 31/022466 136/255 |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1* | 3/2006 | Bude ................ H01L 27/14649 438/481 |
| 2006/0073681 A1* | 4/2006 | Han .............................. 438/479 |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1* | 5/2007 | Maa et al. ...................... 438/57 |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1 551 063 | 7/2005 |
| EP | 1796180 | 6/2007 |
| GB | 2215514 | 9/1989 |
| JP | 2-62090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000-286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004-200375 | 7/2004 |

(56) References Cited

FOREIGN PATENT DOCUMENTS

| | | |
|---|---|---|
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO-02086952 | 10/2002 |
| WO | WO02088834 | 11/2002 |
| WO | WO03073517 | 9/2003 |
| WO | WO2004004927 | 1/2004 |
| WO | WO-2005013375 | 2/2005 |
| WO | WO-2005048330 | 5/2005 |
| WO | WO2005098963 | 10/2005 |
| WO | WO-2005122267 | 12/2005 |
| WO | WO2006025407 | 3/2006 |
| WO | WO-2006125040 | 11/2006 |
| WO | WO2008124154 | 10/2008 |

OTHER PUBLICATIONS

International Preliminary Report on Patentability for International Application No. PCT/US07/021023, mailed Apr. 9, 2009 (8 pages).

International Preliminary Report on Patentability for International Application No. PCT/US2007/020181, mailed Apr. 2, 2009 (9 pages).

International Preliminary Report on Patentability for International Application No. PCT/US07/020777, mailed Apr. 9, 2009 (12 pages).

Partial International Search Report for International Application No. PCT/US2008/068377, mailed Apr. 7, 2009 (7 pages).

International Search Report and Written Opinion for International Application No. PCT/US07/022392, mailed Apr. 11, 2008 (20 pages).

Examination Report in European Patent Application No. 06800414.2, mailed Mar. 5, 2009 (3 pages).

IPRP for International Application No. PCT/US2006/033859, mailed Mar. 20, 2008.

"Communication pursuant to Article 94(3) EPC," Application No. 06 770 525.1-2203, Applicant: Taiwan Semiconductor Company, Ltd., Feb. 17, 2011, 4 pages.

Ames, "Intel Says More Efficient Chips are Coming," PC World, available at: http://www.pcworld.com/printable/article/id,126044/printable.html (Jun. 12, 2006); 4 pages.

Asaoka, et al., "Observation of 1 f $^x$/noise of GaInP/GaAs triple barrier resonant tunneling diodes," AIP Conf. Proc., vol. 780, Issue 1, 2005, pp. 492-495.

Belyaev, et al., "Resonance and current instabilities in AlN/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.

Calado, et al., "Modeling of a resonant tunneling diode optical modulator," University of Algarve, Department of Electronics and Electrical Engineering, 2005, pp. 96-99.

Campo et al., "Comparison of Etching Processes of Silicon and Germanium in SF6-O2 Radio-Frequency Plasma," 13 Journal of Vac. Sci. Tech., B-2, 1995, pp. 235-241.

Chang et al. "3-D simulation of strained Si/SiGe heterojunction FinFETs" Semiconductor Device Research Symposium, Dec. 10-12, 2003, pp. 176-177.

Chengrong, et al., "DBRTD with a high PVCR and a peak current density at room temperature," Chinese Journal of Semiconductors vol. 26, No. 10, Oct. 2005, pp. 1871-1874.

Choi, et al., "Low-voltage low-power K-band balanced RTD-based MMIC VCO," 2006 IEEE, Department of EECS, Korea Advanced Institute of Science and Technology, 2006, pp. 743-746.

Dong et al., "Selective area growth of InP through narrow openings by MOCVD and its application to inP HBT," Indium Phosphide and Related Materials, International Conference, May 12-16, 2003, pp. 389-392.

European Patent Office, Extended European Search Report and Search Opinion dated Jan. 26, 2011 in EP Patent Application No. 10003084.0-2203 (9 pages).

European Search Report issued by the European Patent Office on Dec. 15, 2010 in European Patent Application No. 10002884.4 (10 pages).

Golka, et al., "Negative differential resistance in dislocation-free GaN/AlGan double-barrier diodes grown on bulk GaN," 88 Applied Physics Letters 17, Apr. 2006, pp. 172106-1-172106-3.

Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.

Gruber, et al., "Semimagnetic Resonant Tunneling Diodes for Electron Spin Manipulation," Nanostructures: Physics & Technology, 8th International Symposium, 2000, pp. 483-486.

Hammerschmidt, "Intel to Use Trigate Transistors from 2009 on," EETIMES Online, available at: http://www.eetimes.com/showArticle.jhtml?articleID=189400035 (Jun. 12, 2006). 1 page.

Hasegawa, et al., "Sensing Terahertz Signals with III-V Quantum Nanostructures," Quantum Sensing: Evolution and Revolution from Past to Future, SPIE 2003, pp. 96-105.

Hydrick et al., "Chemical Mechanical Polishing of Epitaxial Germanium on $SiO_2$-patterned Si(001) Substrates," ECS Transactions, 16 (10), 2008, (pp. 237-248).

Intel Press Release, "Intel's Tri-Gate Transistor to Enable Next Era in Energy-Efficient Performance," Intel Corporation (Jun. 12, 2006). 2 pages.

Intel to Develop Tri-Gate Transistors Based Processors, available at: http://news.techwhack.com/3822/tri-gate-transistors/ (Jun. 13, 2006) 6 pages.

International Preliminary Report on Patentability for International Application No. PCT/US2007/022392 mailed Apr. 30, 2009, 14 pages.

International Search Report and Written Opinion for International Application No. PCT/US2007/021023 mailed Jun. 6, 2008, 10 pages.

International Search Report and Written Opinion for International Application No. PCT/US2008/068377, mailed Jul. 6, 2009, 19 pages.

International Search Report for International Application No. PCT/US2006/019152, mailed May 17, 2005. 11 pages.

Ishibashi, et al., "3rd Topical Workshop on Heterostructure Microelectronics for Information Systems Applications," Aug.-Sep. 1998, 115 pages.

Jeong, et al., "Performance improvement of InP-based differential HBT VCO using the resonant tunneling diode," 2006 International Conf. on Indium Phosphide and Related Mat. Conf. Proc., pp. 42-45.

Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).

Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.

Kim et al., "Silicon-Based Field-Induced Band-to-Band Tunneling Effect Transistor," IEEE Electron Device Letters, No. 25, No. 6, 2004, pp. 439-441.

Kollonitsch, et al., "Improved Structure and Performance of the GaAsSb/InP Interface in a Resonant Tunneling Diode," Journal of Crystal Growth, vol. 287, 2006, pp. 536-540.

(56) References Cited

OTHER PUBLICATIONS

Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-194.
Kwok K. Ng, "Resonant-Tunneling Diode," Complete Guide to Semiconductor Devices, Chapter 10. Nov. 3, 2010, pp. 75-83.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.
Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.
Ma, et al., "A small signal equivalent circuit model for resonant tunneling diode," Chinese Physics Letters, vol. 23, No. 8, Aug. 2006, pp. 2292-2295.
Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High PVCR Si/Si1-x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs," 44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.
Notification of Transmittal of the International Search Report and the Written Opinion of the International Searching Authority for PCT/US2010/029552, Applicant: Taiwan Semiconductor Manufacturing Company, Ltd., May 26, 2010, 14 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Park et al., "Fabrication of Low-Defectivity, Compressively Strained Geon $Si_{0.2}G^e_{0.8}$ Structures Using Aspect Ratio Trapping," Journal of the Electrochemical Society, vol. 156, No. 4, 2009, pp. H249-H254.
Partial International Search Report for International Application No. PCT/US2008/004564 completed Jul. 22, 2009, mailed Oct. 16, 2009, 5 pages.
PCT International Search Report of PCT/US2009/057493, from PCT/ISA/210, mailed Mar. 22, 2010, Applicant: Amberwave System Corporation et al., 2 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Sass, et al., "Strain in GaP/GaAs and GaAs/GaP resonant tunneling heterostructures," Journal of Crystal Growth, vol. 248, Feb. 2003, pp. 375-379.
Shubert, E.F., "Resonant tunneling diode (RTD) structures," Rensselear Polytechnic Institute, 2003, pp. 1-14.
Sudirgo et al., "Si-Based Resonant Interband Tunnel Diode/CMOS Integrated Memory Circuits," Rochester Institute of Technology, IEEE, 2006, pp. 109-112.
Suhara, et al, "Characterization of argon fast atom beam source and its application to the fabrication of resonant tunneling diodes," 2005 International Microprocesses and Nanotechnology Conf. Di. of Papers, 2005, pp. 132-133.
Sun et al., "Electron resonant tunneling through InAs/GaAs quantum dots embedded in a Schottky diode with an AlAs insertion layer," 153 J. Electrochemical Society 153, 2006, pp. G703-706.
Sun et al., "Room-temperature observation of electron resonant tunneling through InAs/AlAs quantum dots," 9 Electrochemical and Solid-State Letters 5, May 2006, pp. G167-170.
Suzuki, et al., "Mutual injection locking between sub-THz oscillating resonant tunneling diodes," Japan Science and Technology Agency, IEEE, Joint $30^{th}$ International Conference on Infrared and Millimeter Waves & $13^{th}$ International, 2005.
Thelander, et al., "Heterostructures incorporated in one-dimensional semiconductor materials and devices," Physics of Semiconductors, vol. 171, 2002, 1 page. Abstract Only.
Ting, et al., "Modeling Spin-Dependent Transport in InAS/GaSb/AlSb Resonant Tunneling Structures," 1 J. Computational Electronics, 2002, pp. 147-151.
Tsai, et al., "InP/InGaAs resonant tunneling diode with six-route negative differential resistances," 13th European Gallium Arsenide and other Compound Semiconductors Application Symp., 2006, pp. 421-423.
Walker, et al., "Magnetotunneling spectroscopy of ring-shaped (InGa)As quantum dots: Evidence of excited states with 2pz character," 32 Physica E 1-2, May 2006, pp. 57-60.
Watanabe, et al., "Fluoride resonant tunneling diodes on Si substrates," IEEE International Semiconductor Device Research Symp. Dec. 2005, pp. 177-178.
Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechanical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Yanlong, et al., "Monolithically fabricated OEICs using RTD and MSM," Chinese Journal Semiconductors vol. 27, No. 4, Apr. 2006, pp. 641-645.
Yili, et al., "Physics-based hydrodynamic simulation of direct current characteristics in DBRTD," 29 Chinese J. Electron Devices 2, Jun. 2006, pp. 365-368.
Ying-Long, et al., "Resonant tunneling diodes and high electron mobility transistors integrated on GaAs substrates," Chinese Physics Letters 23, vol. 3, Mar. 2006, pp. 697-700.
Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-462.

(56) References Cited

OTHER PUBLICATIONS

68 Applied Physics Letters 7, pp. 774-779 (1999). (trans. of relevant portions attached).
Asano, T. et al., "AlGaInN laser diodes grown on an ELO-GaN substrate vs. on a sapphire substrate," 2000 IEEE Semiconductor Laser Conference, Conference Digest, pp. 109-110.
Ashby, C.I.H. et al., "Low-dislocation-density GaN from a single growth on a textured substrate," Applied Physics Letters, v 77, n 20, Nov. 13, 2000, pp. 3233-3235.
Ashley et al., "Heternogeneous InSb Quantum Well Transistors on Silicon for ultra-high speed, low power logic applications," 43 Electronics Letters 14 (Jul. 2007).
Bai et al, "Study of the defect elimination mechanisms in aspect ratio trapping Ge growth," Appl. Phys. Letters, vol. 90 (2007).
Bakkers et al., "Epitaxial Growth on InP Nanowires on Germanium," Nature Materials, vol. 3 (Nov. 2004), pp. 769-773.
Baron et al., "Chemical Vapor Deposition of Ge Nanocrystals on SiO2," Applied Physics Letters, vol. 83, No. 7 (Aug. 18, 2003), pp. 1444-1446.
Beckett et al., "Towards a reconfigurable nanocomputer platform," ACM Int'l. Conf. Proceeding Series, vol. 19, pp. 141-150 (2002).
Beltz et al., "A Theoretical Model for Threading Dislocation Reduction During Selective Area Growth," Materials Science and Engineering, A234-236 (1997), pp. 794-797.
Borland, J.O., "Novel device structures by selective epitaxial growth (SEG)," 1987 International Electron Devices Meeting pp. 12-15.
Bryskiewicz, T., "Dislocation filtering in SiGe and InGaAs buffer layers grown by selective lateral overgrowth method," Applied Physics Letters, v 66, n 10, Mar. 6, 1995, pp. 1237-1239.
Bushroa, A.R. et al., "Lateral epitaxial overgrowth and reduction in defect density of 3C-SiC on patterned Si substrates," Journal of Crystal Growth, v 271, Oct. 15, 2004, pp. 200-206.
Cannon et al., "Monolithic Si-based Technology for Optical Receiver Circuits," Proceedings of SPIE, vol. 4999 (2003), pp. 145-155.
Chan et al., "Influence of metalorganic Sources on the Composition Uniformity of Selectively Grown GaxIn1-xP," Jpn J. Appl. Phys., vol. 33 (1994) pp. 4812-4819.
Chang et al., "Epitaxial Lateral Overgrowth of Wide Dislocation-Free GaAs on Si Substrates," Electrochemical Soc'y Proceedings, vol. 97-21, pp. 196-200. 1998.
Chang, Y.S. et al., "Effect of growth temperature on epitaxial lateral overgrowth of GaAs on Si substrate," Journal of Crystal Growth 174, Apr. 1997, p. 630-634.
Chau et al., "Opportunities and Challenges of III-V Nanoelectronics for Future High-Speed, Low Power Logic Applications," IEEE CSIC Digest, pp. 17-20 (2005).
Chen, Y. et al., "Dislocation reduction in GaN thin films via lateral overgrowth from trenches," Applied Physics Letters, v 75, n 14, Oct. 4, 1999, pp. 2062-2063.
Dadgar et al., "MOVPE Growth of GaN on Si (111) Substrates," Journal of Crystal Growth, 248 (2003) pp. 556-562.
Datta et al., "Silicon and III-V Nanoelectronics," IEEE Int'l. Conf. on Indium Phosphide & Related Mat., pp. 7-8 (2005).
Datta et al., "Ultrahigh-Speed 0.5 V Supply Voltage $In_{0.7}Ga_{0.3}As$ Quantum-Well Transistors on Silicon Substrate," 28 Electron Device Letters 8, pp. 685-687 (2007).
Davis, R.F. et al., "Lateral epitaxial overgrowth of and defect reduction in GaN thin films," 1998 IEEE Lasers and Electro-Optics Society Annual Meeting,pp. 360-361.
de Boeck et al., "The fabrication on a novel composite GaAs/SiO2 nucleation layer on silicon for heteroepitaxial overgrowth by molecular beam epitaxy," Mat. Sci. and Engineering, B9 (1991), pp. 137-141.
Dong et al., "Selective area growth of InP through narrow openings by MOCVD and its application to InP HBT," 2003 International Conference on Indium Phosphide and Related Materials,pp. 389-392.

Dong-Ho Kim et al., "GaN nano epitaxial lateral overgrowth on holographically patterned substrates," 2003 International Symposium on Compound Semiconductors, pp. 27-28.
Epitaxial Lateral Overgrowth of GaAs on a Si Substrate, 28 Jap. J. App. Physics 3, pp. L337-L339 (Mar. 1989).
Fang et al., "Electrically pumped hybrid AlGaInAs—silicon evanescent laser," 14 Optics Express 20, pp. 9203-9210 (2006).
Feltin, E. et al., "Epitaxial lateral overgrowth of GaN on Si (111)," Journal of Applied Physics, v 93, n 1, Jan. 1, 2003, pp. 182-185.
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9 (1990), pp. 949-955.
Fitzgerald et al., "Epitaxial Necking in GaAs Grown on Prepatterned Si Substrates," Journal of Electronic Materials, vol. 20, No. 10 (1991), pp. 839-853.
Fitzgerald et al., "Nucleation Mechanisms and the Elimination of Misfit Dislocations at Mismatched Interfaces by Reduction in Growth Area," J. Applied Phys., vol. 65, No. 6, (Mar. 15, 1989), pp. 2220-2237.
Fitzgerald, "The Effect of Substrate Growth Area on Misfit and Threading Dislocation Densities in Mismatched Heterostructures," J. Vac. Sci. Technol., vol. 7, No. 4 (Jul./Aug. 1989), pp. 782-788.
Gallagher et al., "Development of the magnetic tunnel junction MRAM at IBM: From first junctions to a 16-MB MRAM demonstrator chip," 50 IBM J. Research & Dev. 1 (2006).
Gallas et al, "Influence of Doping on Facet Formation at the $SiO_2$/Si Interface," Surface Sci. 440, pp. 41-48 (1999).
Geppert, L., "Quantum transistors: toward nanoelectronics," IEEE Spectrum, pp. 46-51 (Sep. 2000).
Glew et al., "New DFB grating structure using dopant-induced refractive index step," J. Crystal Growth 261 (2004) pp. 349-354.
Gould et al., "Magnetic resonant tunneling diodes as voltage-controlled spin selectors," 241 Phys. Stat. Sol. (B) 3, pp. 700-703 (2004).
Groenert et al., "Monolithic integration of room-temperature cw GaAs/AlGaAs lasers on Si substrates via relaxed graded GeSi buffer layers," 93 J. Appl. Phys. 362 (2003).
Gustafsson et al., "Cathodoluminescence from relaxed $Ge_xSi_{1-x}$ grown by heteroepitaxial lateral overgrowth," J. Crystal Growth 141 (1994), pp. 363-370.
Gustafsson et al., "Investigations of high quality $Ge_xSi_{1-x}$ grown by heteroepitaxial lateral overgrowth using cathodoluminescence," Inst. Phys. Conf. Ser. No. 134: Section 11, pp. 675-678 (1993).
Hayafuji et al., Jap. J. Appl. Phys. 29, pp. 2371 (1990).
Hersee, et al., "The Controlled Growth of GaN Nanowires," Nano Letters, vol. 6, No. 8 (2006), pp. 1808-1811.
Hiramatsu, K. et al., "Fabrication and characterization of low defect density GaN using facet-controlled epitaxial lateral overgrowth (FACELO)," Journal of Crystal Growth, v 221, Dec. 2000, pp. 316-326.
Hollander et al., "Strain and Misfit Dislocation Density in Finite Lateral Size $Si_{1-x}Ge_x$ Films Grown by Sective Epitaxy," Thin Solid Films, vol. 292, (1997) pp. 213-217.
Huang et al., "Electron and Hole Mobility Enhancement in Strained SOI by Wafer Bonding," 49 IEEE Trans. on Electron Devices 9, pp. 1566-1570 (2002).
International Search Report and Written Opinion for Patent Application No. PCT/US2006/019152, dated Oct. 19, 2006.
International Search Report and Written Opinion for Patent Application No. PCT/US2006/029247, dated May 7, 2007.
International Search Report and Written Opinion for International Application No. PCT/US2006/033859, dated Sep. 12, 2007 (22 pages).
Ipri, A.C. et al., "MONO/POLY technology for fabricating low-capacitance CMOS integrated circuits," IEEE Transactions on Electron Devices, vol. 35, No. 8, pp. 1382-1383, Aug. 1988.
Ishitani et al., "Facet Formation in Selective Silicon Epitaxial Growth," 24 Jap. J. Appl. Phys. 10, pp. 1267-1269 (1985).
Jing Wang et al., "Fabrication of patterned sapphire substrate by wet chemical etching for maskless lateral overgrowth of GaN," Journal of the Electrochemical Society, v. 153, n. 3, Mar. 2006, pp. C182-185.

(56) References Cited

OTHER PUBLICATIONS

Ju, W. et al., "Epitaxial lateral overgrowth of gallium nitride on silicon substrate," Journal of Crystal Growth, v. 263, Mar. 1, 2004, pp. 30-34.
Kamiyama, S. et al., "UV laser diode with 350.9-nm-lasing wavelength grown by hetero-epitaxial-lateral overgrowth technology," IEEE Journal of Selected Topics in Quantum Electronics, vol. 11, No. 5, pp. 1069-1073, Sep.-Oct. 2005.
Kamiyama, S. et al., "UV light-emitting diode fabricated on hetero-ELO-grown $Al_{0.22}Ga_{0.78}N$ with low dislocation density," Physica Status Solidi A, v 192, n 2, Aug. 2002, pp. 296-300.
Kazi et al., "Realization of GaAs/AlGaAs Lasers on Si Substrates Using Epitaxial Lateral Overgrowth by Metalorganic Chemical Vapor Deposition," Jpn. J. Appl. Physics, vol. 40 (2001), pp. 4903-4906.
Kidoguchi, I. et al., "Air-bridged lateral epitaxial overgrowth of GaN thin films," Applied Physics Letters, v 76, n 25, Jun. 19, 2000, p. 3768-3770.
Kimura et al., "Vibronic Fine Structure Found in the Blue Luminescence from Silicon Nanocolloids," Jpn. J. Appl. Physics, vol. 38 (1999), pp. 609-612.
Klapper, "Generation and Propagation of Dislocations During Crystal Growth," Mat. Chem. and Phys. 66, pp. 101-109 (2000).
Knall et al., Threading Dislocations in GaAs Grown with Free Sidewalls on Si mesas, J Vac. Sci. Technol. B, vol. 12, No. 6, (Nov./Dec. 1994) pp. 3069-3074.
Krost et al., "GaN-based Optoelectronics on Silicon Substrates," Materials Science & Engineering, B93 (2002) pp. 77-84.
Kushida, K. et al., "Epitaxial growth of $PbTiO_3$ films on $SrTiO_3$ by RF magnetron sputtering," IEEE Transactions on Ultrasonics, Ferroelectrics and Frequency Control, vol. 38, No. 6, pp. 656-662, Nov. 1991.
Kwok K Ng, Complete Guide to Semiconductor Devices, 2nd ed., Chapter 18 (2002).
Langdo et al., "High Quality Ge on Si by Epitaxial Necking," Applied Physics Letters, vol. 76, No. 25 (Jun. 19, 2000), pp. 3700-3702.
Langdo, "Selective SiGe Nanostructures," Ph.D. Thesis, Massachusetts Institute of Technology (2001).
Lee et al., "Strained-relieved, Dislocation-free $In_xGa_{1-x}As$/GaAs(001) Heterostructure by Nanoscale-patterned Growth," Applied Physics Letters, vol. 85, No. 18 (Nov. 1, 2004), pp. 4181-4183.
Lee, S.C. et al., "Growth of GaN on a nanoscale periodic faceted Si substrate by metal organic vapor phase epitaxy," 2003 International Symposium on Compound Semiconductors: Post-Conference Proceedings, pp. 15-21.
Li et al, "Heteroepitaxy of High-quality Ge on Si by Nanoscale Ge seeds Grown through a Thin Layer of $SiO_2$," Applied Physics Letters, vol. 85, No. 11 (Sep. 13, 2004), pp. 1928-1930.
Li et al., Defect Reduction of GaAs Epitaxy on Si (001) Using Selective Aspect Ratio Trapping, 91 Applied Physics Letters 021114-1-021114-3 (2007).
Li et al., "Morphological Evolution and Strain Relaxation of Ge Islands Grown on Chemically Oxidized Si(100) by Molecular-beam Epitaxy," Journal of Applied Physics, vol. 98, (2005), pp. 073504-1-073504-8.
Li et al., "Selective Growth of Ge on Si(100) through vias of $SiO_2$ Nanotemplate Using Solid Source Molecular Beam Epitaxy," Applied Physics Letters, vol. 83, No. 24 (Dec. 15, 2003), pp. 5032-5034.
Liang et al., "Critical Thickness Enhancement of Epitaxial SiGe films Grown on Small Structures," Journal of Applied Physics, vol. 97, (2005) pp. 043519-1-043519-7.
Lim et al., "Facet Evolution in Selective Epitaxial Growth of Si by cold-wall ultrahigh vacuum chemical vapor deposition," J. Vac. Sci. Tech. B 22(2), p. 682 (2004).
Liu et al., "High Quality Single-crystal Ge on Insulator by Liquid-phase Epitaxy on Si Substrates," Applied Physics Letters, vol. 84, No. 14, (Apr. 4, 2004) pp. 2563-2565.
Liu et al., "Rapid Melt Growth of Germanium Crystals with Self-Aligned Microcrucibles on Si Substrates," Journal of the Electrochemical Society, vol. 152, No. 8, (2005) G688-G693.
Loo et al., "Successful Selective Epitaxial $Si_{1-x}Ge_x$ Deposition Process for HBT-BiCMOS and high Mobility Heterojunction pMOS Applications," 150 J. Electrochem. Soc'y 10, pp. G638-G647 (2003).
Lourdudoss, S. et al., "Semi-insulating epitaxial layers for optoelectronic devices," 2000 IEEE International Semiconducting and Insulating Materials Conference, pp. 171-178, 2000.
Luan et al., "High-quality Ge Epilayers on Si with Low Threading-dislocation Densities," Applied Phsics Letters, vol. 75, No. 19, (Nov. 8, 1999) pp. 2909-2911.
Luan, "Ge Photodectors for Si Microphotonics," Ph.D. Thesis, Massachusetts Institute of Technology, Feb. 2001.
Lubnow et al., "Effect of III/V-Compound Epitaxy on Si Metal-Oxide-Semiconductor Circuits," Jpn. J. Applied Phys., vol. 33 (1994) pp. 3628-3634.
Luryi et al., "New Approach to the High Quality Epitaxial Growth of Latticed-mismatch Materials," Appl. Phys. Lett., vol. 49, No. 3, (Jul. 21, 1986) pp. 140-142.
Martinez et al., "Characterization of GaAs Conformal Layers Grown by Hydride Vapour Phase Epitaxy on Si Substrates by Microphotoluminescence Cathodoluminescence and microRaman," Journal of Crystal Growth, vol. 210 (2000) pp. 198-202.
Matsunaga et al., "A New Way to Achieve Dislocation-free Heteroepitaxial Growth by Molecular Beam Epitaxy: Vertical Microchannel Epitaxy," Journal of Crystal Growth, 237-239 (2002) pp. 1460-1465.
Monroy et al., "High UV/visible contrast photodiodes based on epitaxial lateral overgrown GaN layers," Electronics Letters, vol. 35, No. 17, pp. 1488-1489, Aug. 19, 1999.
Nakano, K. et al., "Epitaxial lateral overgrowth of AlN layers on patterned sapphire substrates," Source: Physica Status Solidi A, v. 203, n. 7, May 2006, pp. 1632-1635.
Nam et al., "Lateral Epitaxy of Low Defect Density GaN Layers via Organometallic Vapor Phase Epitaxy," Appl. Phys. Letters, vol. 71, No. 18, (Nov. 3, 1997) pp. 2638-2640.
Naoi et al, "Epitaxial Lateral Overgrowth of GaN on Selected-area Si(111) Substrate with Nitrided Si Mask," Journal of Crystal Growth, vol. 248, (2003) pp. 573-577.
Naritsuka et al., "InP Layer Grown on (001) Silicon Substrate by Epitaxial Lateral Overgrowth," Jpn. J. Appl. Physics, vol. 34 (1995), pp. L1432-L1435.
Naritsuka et al., "Vertical Cavity Surface Emitting Laser Fabricated on GaAs Laterally Grown on Si Substrate," Electrochemical Soc'y Proc. vol. 97-21, pp. 86-90. 1989.
Neudeck et al., "Novel silicon epitaxy for advanced MOSFET devices," 2000 IEDM Technical Digest, pp. 169-172.
Norman, A.G. et al., "Characterization of MOCVD lateral epitaxial overgrown III-V semiconductor layers on GaAs substrates," 2003 International Symposium onCompound Semiconductors, pp. 45-46.
Parillaud et al, "High Quality InP on Si by Conformal Growth," Appl. Phys. Lett., vol. 68, No. 19 (May 6, 1996) pp. 2654-2656.
Park et al., "Defect Reduction and Its Mechanism of Selective Ge Epitaxy in Trenches on Si(001) Substrates Using Aspect Ratio Trapping," Mat. Res. Soc'y Symp. Proc., vol. 994 (2007).
Park et al., "Defect Reduction of Selective Ge Epitaxy in Trenches on Si(001) Substrates using Aspect Ratio Trapping," 90 Appl. Physics Letters (2007).
Park et al., "Growth of Ge Thick Layers on Si(001) Substrates Using Reduced Pressure Chemical Vapor Deposition," 45 Japanese J. Applied Physics 11, pp. 8581-8585 (2006).
Partial International Search for International Application No. PCT/US2006/033859, 7 pages. 2007.
Piffault, N. et al., "Assessment of the strain of InP films on Si obtained by HVPE conformal growth," Sixth International Conference on Indium Phosphide and Related Materials, Conference Proceedings., pp. 155-158, Mar 27-31, 1994.
Pribat et al., "High Quality GaAs on Si by Conformal Growth," Appl. Phys. Lett., vol. 60, No. 17 (Apr. 27, 1992) pp. 2144-2146.

(56) References Cited

OTHER PUBLICATIONS

Reed et al., "Realization of a three-terminal resonant tunneling device: the bipolar quantum resonant tunneling transistor," 54 Appl. Phys. Letters 11, pp. 1034 (1989).
Ren, D. et al., "Low-dislocation-density, nonplanar GaN templates for buried heterostructure lasers grown by lateral epitaxial overgrowth," Applied Physics Letters, v 86, Mar. 14, 2005, 111901-1-111901-3.
Rim et al., "Fabrication and mobility characteristics of ultra-thin strained Si Directly on Insulator (SSDOI) MOSFETs," 2003 IEDM Tech. Dig., pp. 49-52.
Ringel et al., "Single-junction InGaP/GaAs Solar Cells Grown on Si Substrates with SiGe Buffer Layers," Prog. Photovolt.: Res. & Appl. 2002, 10:417-426.
Sakai, "Defect Structure in Selectively Grown GaN films with low threading dislocation density," Appl. Physics Letters 71(16), pp. 2259-2261 (1997).
Sakai, "Transmission electron microscopy of defects in GaN films formed by epitaxial lateral overgrowth," 73 App. Physics Letters 4, pp. 481-483 (1998).
Sakawa et al., "Effect of Si Doping on Epitaxial Lateral Overgrowth of GaAs on GaAs-Coated Si Substrate," Jpn. J. Appl. Physics, vol. 31 (1992), pp. L359-L361.
Sangwoo Pae et al., "Multiple layers of silicon-on-insulator islands fabrication by selective epitaxial growth," IEEE Electron Device Letters, vol. 20, No. 5, pp. 194-196, May 1999.
Schaub, J.D. et al., "Resonant-cavity-enhanced high-speed Si photodiode grown by epitaxial lateral overgrowth," IEEE Photonics Technology Letters, vol. 11, No. 12, pp. 1647-1649, Dec. 1999.
Seabaugh et al., "Promise of Tunnel Diode Integrated Circuits," Tunnel Diode and CMOS/HBT Integration Workshop, Dec. 9, 1999, Naval Research Laboratory.
Shahidi, G. et al., "Fabrication of CMOS on ultrathin SOI obtained by epitaxial lateral overgrowth and chemical-mechanical polishing," 1990 IEDM Technical Digest., pp. 587-590.
Siekkinen, J.W. et al., "Selective epitaxial growth silicon bipolar transistors for material characterization," IEEE Transactions on Electron Devices, vol. 35, No. 10, pp. 1640-1644, Oct. 1988.
Su et al., "Catalytic Growth of Group III-nitride Nanowires and Nanostructures by Metalorganic Chemical Vapor Deposition," Applied Physics Letters, vol. 86 (2005) pp. 013105-1-013105-3.
Su et al., "New planar self-aligned double-gate fully-depleted P-MOSFETs using epitaxial lateral overgrowth (ELO) and selectively grown source/drain (S/D)," 2000 IEEE International SOI Conference, pp. 110-111.
Sun, Y. et al., "Temporally resolved growth of InP in the openings off-oriented from [110] direction," 2000 International Conference on Indium Phosphide and Related Materials, Conference Proceedings, pp. 227-230.
Sun, Y.T. et al., "InGaAsP multi-quantum wells at 1.5 μm wavelength grown on indium phosphide templates on silicon," 2003 International Conference on Indium Phosphide and Related Materials, pp. 277-280.
Sun, Y.T.; Lourdudoss, S., "Sulfur doped indium phosphide on silicon substrate grown by epitaxial lateral overgrowth," 2004 International Conference on Indium Phosphide and Related Materials, pp. 334-337.
Sun, Y.T.; Napierala, J.; Lourdudoss, S., "Selective area growth of InP on InP precoated silicon substrate by hydride vapor phase epitaxy," 2002 International Conference on Indium Phosphide and Related Materials Conference, pp. 339-342.
Suryanarayanan, G. et al., "Microstructure of lateral epitaxial overgrown InAs on (100) GaAs substrates," Applied Physics Letters, v 83, n 10, Sep. 8, 2003, pp. 1977-1979.
Takasuka et al., "AlGaAs/InGaAs DFB Laser by One-Time Selective MOCVD Growth on a Grating Substrate," 43 Jap. J. App. Phys. 4B (2004) pp. 2019-2022.
Takasuka et al., "InGaAs/AlGaAs Quantum Wire DFB Buried HeteroStructure Laser Diode by One-Time Selective MOCVD on Ridge Substrate," 44 Jap. J. App. Phys. 4B (2005) pp. 2546-2548.
Tamura et al., "Threading Dislocations in GaAs on Pre-patterned Si and in Post-patterned GaAs on Si," Journal of Crystal Growth, vol. 147, (1995) pp. 264-273.
Tanaka et al., "Structural Characterization of GaN Laterally Overgrown on a (111) Si Substrate," Applied Physics Letters, vol. 79, No. 7 (Aug. 13, 2001) pp. 955-957.
Tomiya, S. et al., "Dislocation related issues in the degradation of GaN-based laser diodes," IEEE Journal of Selected Topics in Quantum Electronics, vol. 10, No. 6, pp. 1277-1286, Nov.-Dec. 2004.
Tran et al., "Growth and Characterization of InP on Silicon by MOCVD," Journal of Crystal Growth, vol. 121, (1992) pp. 365-372.
Tsang, W. et al., "The heteroepitaxial ridge-overgrown distributed feedback laser," IEEE Journal of Quantum Electronics, vol. QE-21, No. 6, pp. 519-526, Jun. 1985.
Tsaur, B.-Y. et al., "Low-dislocation-density GaAs epilayers grown on Ge-coated Si substrates by means of lateral epitaxial overgrowth," Applied Physics Letters, v 41, n 4, Aug. 15, 1982, pp. 347-349.
Tseng et al., "Effects of Isolation Materials on Facet Formation for Silicon Selective Epitaxial Growth," 71 Appl. Phys. Letters 16, pp. 2328 (1997).
Tsuji et al., "Selective Epitaxial Growth of GaAs on Si with Strained Sort-period Superlattices by Molecular Beam Epitaxy under Atomic Hydrogen Irradiation," J. Vac. Sci. Technol. B., vol. 22, No. 3, (May/Jun. 2004) pp. 1428-1431.
Vanamu et al., "Epitaxial Growth of High-quality Ge Films on Nanostructured Silicon Substrates," Applied Physics Letters, vol. 88, (2006) pp. 204104-1-204104-3.
Vanamu et al., "Growth of High Quality Ge/$Si_{1-x}Ge_x$ on Nano-scale Patterned Si Structures," J. Vac. Sci. Techn. B, vol. 23, No. 4, (Jul./Aug. 2005) pp. 1622-1629.
Vanamu et al., "Heteroepitaxial Growth on Microscale Patterned Silicon Structures," Journal of Crystal Growth, vol. 280, (2005) pp. 66-74.
Vanamu et al., "Improving Ge/$Si_xGe_{1-x}$ Film Quality through Growth onto Patterned Silicon Substrates," Advances in Electronics Manufacturing Technology, V-EMT 1:25 (Nov. 8, 2004), pp. 1-4.
Vetury et al., "First Demonstration of AlGaN/GaN Heterostructure Field Effect Transistor on GaN grown by lateral epitaxial overgrowth (ELO)," Inst. Phys. Conf. Ser. No. 162: Ch. 5, pp. 177-183. 1999.
Wernersson et al., "InAs Epitaxial Lateral growth of W Marks," Journal of Crystal Growth, vol. 280 (2005) pp. 81-86.
Wuu, D.S. et al., "Defect reduction and efficiency improvement of near-ultraviolet emitters via laterally overgrown GaN on a GaN/patterned sapphire template," Applied Physics Letters, v 89, n 16, Oct. 16, 2006, pp. 161105-1-161105-3.
Xie et al., "From Porous Si to Patterned Si Substrate: Can Misfit Strain Energy in a Continuous Heteroepitaxial Film Be Reduced?" J Va. Sci. Technol. B, vol. 8, No. 2, (Mar./Apr. 1990) pp. 227-231.
Xu et al., "Spin-filter devices based on resonant tunneling antisymmetrical magnetic semiconductor hybrid structures," 84 App. Phys. Letters 11, pp. 1955-1957 (2004).
Yamaguchi et al., "Analysis for Dislocation Density Reduction in Selective Area Grown GaAs Films on Si Substrates," Appl. Phys. Lett. vol. 56, No. 1, (Jan. 1, 1990) pp. 27-29.
Yamaguchi et al., "GaAs Solar Cells Grown on Si Substrates for Space Use," Prog. Photovolt.: Res. Appl. 2001; 9:191-201.
Yamaguchi et al., "Super-high-efficiency Multi-junction Solar Cells," Prog. Photovolt.: Res. Appl. 2005; 13:125-132.
Yamaguchi et al., "Defect Reduction Effects in GaAs on Si Substrates by Thermal Annealing," Appl. Phys. Letters 53(23), pp. 2293 (1988).
Yamamoto et al., "Optimization of InP/Si Heteroepitaxial Growth Conditions Using Organometallic Vapor Phase Epitaxy," Journal of Crystal Growth, vol. 96, (1989) pp. 369-377.
Yang et al., "High Performance CMOS Fabricated on Hybrid Substrate with Different Crystal Orientations," 2003 IEDM Tech. Dig., pp. 453-456.
Yang et al., "Selective Area Deposited Blue GaN—InGaN Multiple-quantum Well Light Emitting Diodes over Silicon Substrates," Applied Physics Letter, vol. 76, No. 3, (Jan. 17, 2000) pp. 273-275.

(56) References Cited

OTHER PUBLICATIONS

Yoon et al., "Selective Growth of Ge Islands on Noanometer-scale Patterned SiO2/Si by Molecular Beam Epitaxy," Applied Physics Letters, vol. 89 (2006) pp. 063107-1-063107-3.
Zamir et al., "Thermal Microcrack Distribution Control in GaN Layers on Si Substrates by Lateral Confined Epitaxy," Applied Physics Letters, vol. 78, No. 3, (Jan. 15, 2001) pp. 288-290.
Zang, K.Y. et al., "Nanoheteroepitaxial lateral overgrowth of GaN on nanoporous Si(111)," Applied Physics Letters, v 88, n 14, Apr. 3, 2006, p. 141925.
Zang, K.Y. et al., "Nanoscale lateral epitaxial overgrowth of GaN on Si (111)," Applied Physics Letters, v 87, Nov. 7, 2005, p. 193106-1-193106-3.
Zela et al., "Single-crystalline Ge Grown Epitaxially on Oxidized and Reduced Ge/Si (100) Islands," Journal of Crystal Growth, vol. 263 (2004) pp. 90-93.
Zhang et al., "Removal of Threading Dislocations from Patterned Heteroepitaxial Semiconductors by Glide to Sidewalls," Journal of Electronic Materials, vol. 27, No. 11, (1998) pp. 1248-1253.
Zhang et al., "Strain Status of Self-assembled InAs Quantum Dots," Applied Physics Letters, vol. 77, No. 9, (Aug. 28, 2000) pp. 1295-1297.
Zheleva, T.S. et al., "Lateral epitaxy and dislocation density reduction in selectively grown GaN structures," Journal of Crystal Growth, v 222, n 4, Feb. 2001, pp. 706-718.
Zubia et al., "Initial Nanoheteroepitaxial Growth of GaAs on Si(100) by OMVPE." Journal of Electronic Materials, vol. 30, No. 7, (2001) pp. 812-816.
Bean et al., "$Ge_xSi_{1-x}$/Si strained-later superlattice grown by molecular beam epitaxy," J. Vac. Sci. Tech. A (2)2, pp. 436-440 (1984).
Bergman et al. "RTD/CMOS Nanoelectronic Circuits: Thin-Film InP-based Resonant Tunneling Diodes Integrated with CMOS circuits," 20 Electron Device Letters 3, pp. 119-122 (1999).
Blakeslee, "The Use of Superlattices to Block the Propogation of Dislocations in Semiconductors," Mat. Res. Soc. Symp. Proc. 148, pp. 217-227, 1989.
Choi et al., "Monolithic Integration of GaAs/AlGaAs Double-Heterostructure LED's and Si MOSFETS's," Electon Device Letters, v. EDL-7, No. 9 (1986).
Choi et al., "Monolithic Integration of GaAs/AlGaAs LED and Si Driver Circuit," 9 Electron Device Letters 10 (1988).
Choi et al., "Monolithic Integration of Si MOSFETS's and GaAs MESFET's," Electron Device Letters, v. 7, No. 4 (1986).
Cloutier et al., "Optical gain and stimulated emission in periodic nanopatterned crystalline silicon," Nature Materials, Nov. 2005.
Currie et al., "Carrier Mobilities and Process Stability of Strained Si n- and p-MOSFETs on SiGe Virtual Substrates," J. Vac. Sci. Tech. B 19(6), pp. 2268-2279 (2001).
Donaton et al., "Design and Fabrication of MOSFETs with a Reverse Embedded SiGe (Rev. e-SiGe) Structure," 2006 IEDM, pp. 465-468.
Feng et al., "Integration of Germanium-on-Insulator and Silicon MOSFETs on a Silicon Substrate," 27 Electron Device Letters 11, pp. 911-913 (2006).
Fiorenza et al., "Film Thickness Constraints for Manufacturable Strained Silicon CMOS," 19 Semiconductor Sci. Technol., p. L4 (2004).
Fischer et al., "Elastic stress relaxation in SiGe epilayers on patterned Si substrates," 75 Journal of Applied Physics 1, pp. 657-659 (1994).
Fischer et al., "State of stress and critical thickness of Strained small-area SiGe layers," Phys. Stat. Sol. (a) 171, pp. 475-485 (1999).
Fitzgerald et al., "Structure and recombination in InGaAs/GaAs heterostructures," 63 Journal of Applied Physics 3, pp. 693-703 (1988).
Fitzgerald et al., "Totally relaxed $Ge_xSi_{1-x}$ layers with low threading dislocation densities grown on Si Substrates," 59 Applied Physics Letters 7, pp. 811-813 (1991).
Gibbon et al., "Selective-area low-pressure MOCVD of GaInAsP and related materials on planar InP substrates" Semicond Sci Tech. 8, pp. 998-1010 (1993).
Hu et al., "Growth of Well-Aligned Carbon Nanotube arrays on Silicon Substrates using Porous Alumina Film as a Nanotemplate," 79 App. Physics Letters 19 (2001).
International Preliminary Report on Patentability for International Application No. PCT/US2006/019152, dated Nov. 20, 2007.
International Technology Roadmap for Semiconductors—Front End Processes, pp. 1-62 (2005).
International Search Report and Written Opinion for International Application No. PCT/US2007/019568, mailed Feb. 6, 2008.
International Search Report and Written Opinion for International Application No. PCT/US2007/020181, dated Jan. 25, 2008.
International Search Report and Written Opinion for International Application PCT/US2007/007373, dated Oct. 5, 2007.
International Search Report and Written Opinion for International Application No. PCT/US07/020777, mailed Feb. 8, 2008.
IPRP for International Application No. PCT/US2006/029247, mailed Feb. 7, 2008.
Ismail et al., "High-quality GaAs on sawtooth-patterned Si substrates," 59 Applied Physics Letters 19, pp. 2418-2420 (1991).
Jain et al., "Stresses in strained GeSi stripes and quantum structures: calculation using the finite element method and determination using micro-Raman and other measurements," Thin Solid Films 292 (1997) pp. 218-226.
Matthews et al., "Defects in Epitaxial Multilayers—Misfit Dislocations," J. Crystal Growth 27, pp. 118-125(1974).
Neumann et a., "Growth of III-V resonant tunneling diode on Si Substrate with LP-MOVPE," J. of Crystal Growth 248, pp. 380-383 (2003).
Pidin et al., "MOSFET Current Drive Optimization Using Silicon Nitride Capping Layer for 65-nm Technology Node," 2004 Symp. on VLSI Technology, Dig. Tech. Papers, pp. 54-55.
Prost, W., ed. QUDOS Technical Report 2002-2004.
Rim et al., "Enhanced Hole Mobilities in Surface-channel Strained-Si p-MOSFETs," 1995 IEDM, pp. 517-520.
Rosenblad et al., "A Plasma Process for Ultrafast Deposition of SiGe Graded Buffer Layers," 76 Applied Physics Letters 4, pp. 427-429 (2000).
Shichijo et al., "Co-Integration of GaAs MESFET & Si CMOS Circuits," 9 Elec. Device Letters 9 (1988).
Sun et al., "Thermal strain in Indium Phosphide on silicon obtained by Epitaxial Lateral Overgrowth," 94 J. of Applied Physics 4, pp. 2746-2748 (2003).
Tamura et al., "Heteroepitaxy on high-quality GaAs on Si for Optical Interconnections on Si Chip," Proceedings of the SPIE, vol. 2400, pp. 128-139 (1995).
Thean et al., "Uniaxial-Biaxial Hybridization for Super-Critical Strained-Si Directly on Insulator (SC-SSOI) PMOS with Different Channel Orientations," IEEE, pp. 1-4 (2005).
Thompson et al., "A Logic Nanotechnology Featuring Strained-Silicon," 25 IEEE Electron Device Letters 4, pp. 191-193 (2004).
Usuda et al., "Strain relaxation of strained-Si layers on SiGe-on-insulator (SGOI) structures after mesa isolation," Applied Surface Sci. 224, pp. 113-116 (2004).
Usui et al., "Thick GaN Epitaxial Growth with Low Dislocation Density by Hydride Vapor Phase Epitazy," 36 Jap. J. of Applied Physics, pp. L899-L902 (1997).
Vescan et al., "Lateral confinement by low pressure chemical vapor deposition-based selective epitaxial growth of $Si_{1-x}Ge_x$/Si nanostructures," 81 J. of Applied Physics 10, pp. 6709-6715 (1997).
Yin et al., "Ultrathin Strained-SOI by Stress Balance on Compliant Substrates and FET Performance," 52 IEEE Trans. on Electron Devices 10, pp. 2207-2214 (2005).

* cited by examiner

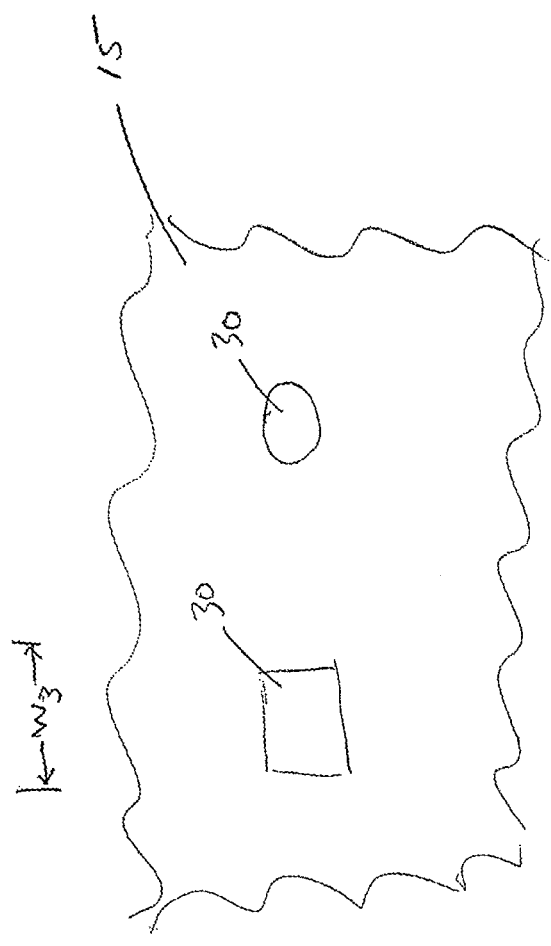

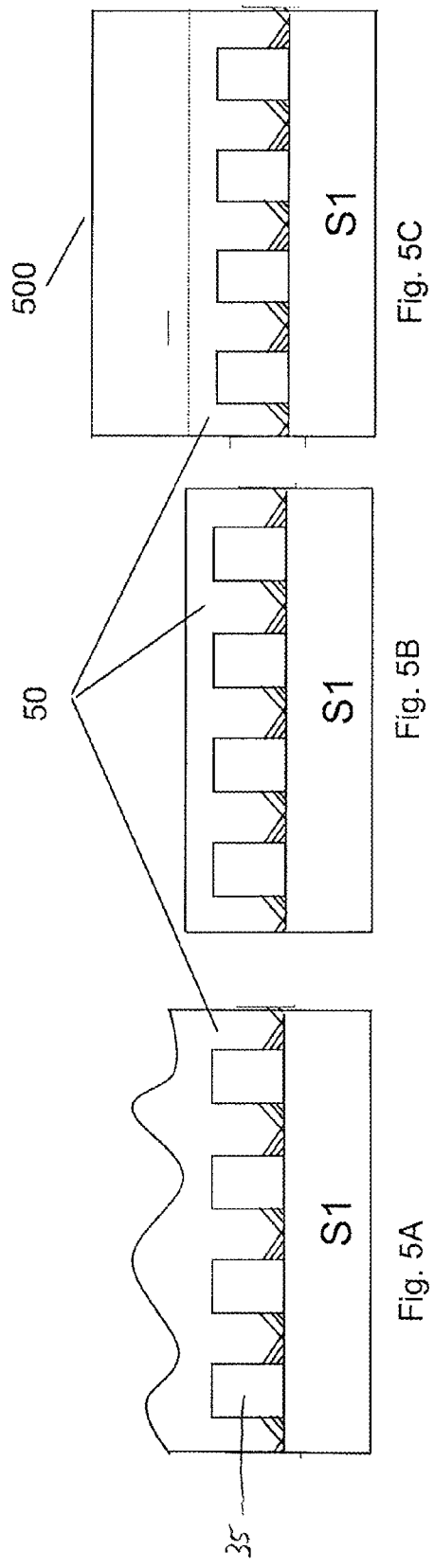

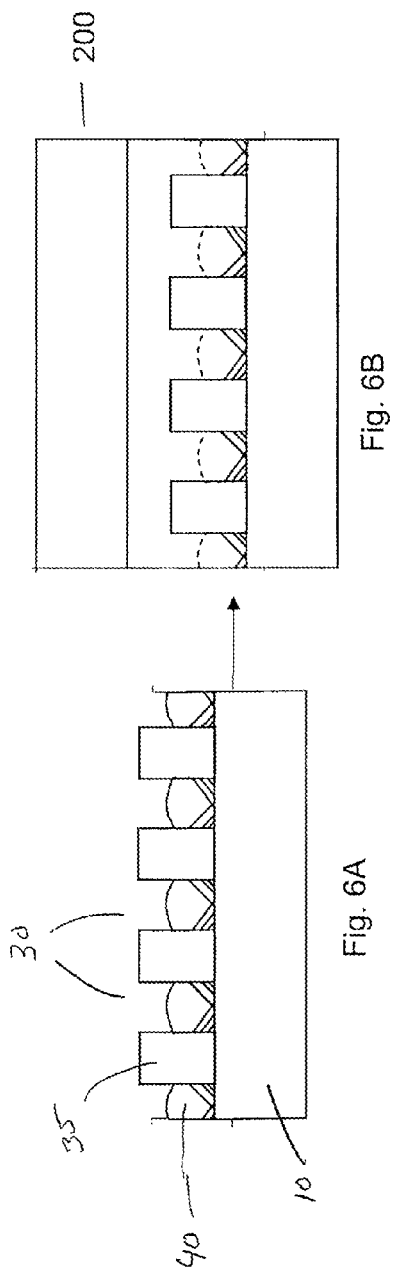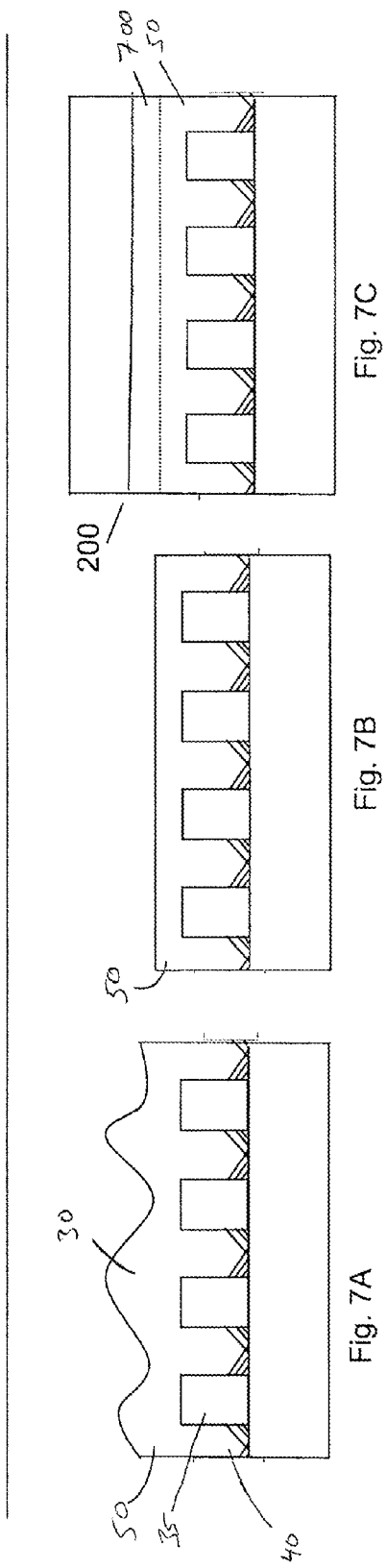

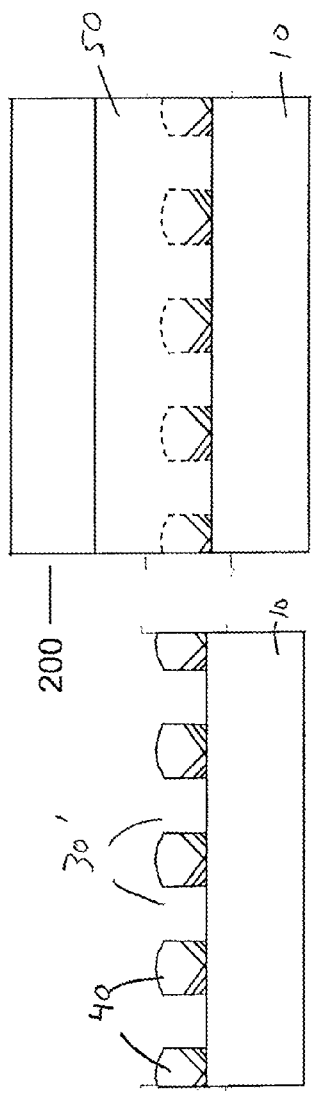
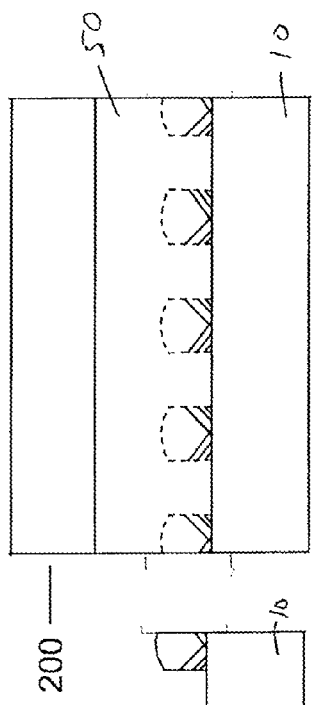
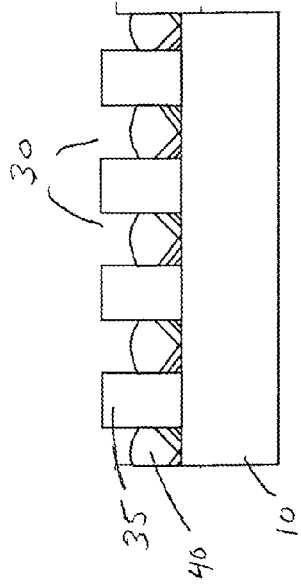
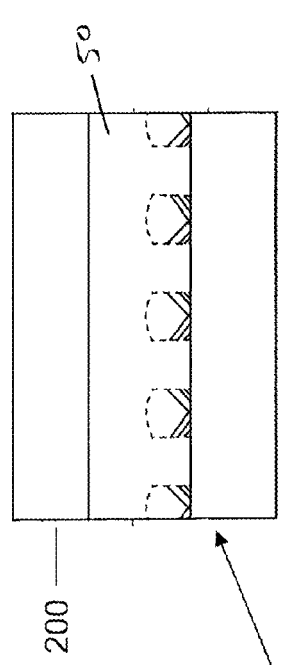
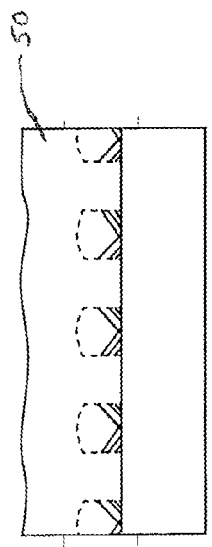

PHOTOVOLTAICS ON SILICON

RELATED APPLICATIONS

This applicant claims the benefit of and priority to U.S. Provisional Application Ser. No. 60/922,533 filed Apr. 9, 2007, the disclosure of which is hereby incorporated by reference in its entirety.

FIELD OF THE INVENTION

The technology disclosed herein relates generally to photovoltaic devices (PVDs).

BACKGROUND AND SUMMARY

Conventional PVDs generally fall into two categories—a first type that uses Si substrates and Si-based materials for active photovoltaic (PV) regions and a second type that uses Ge or GaAs substrates with one or more active PV regions constructed using lattice-matched III-V compound semiconductor materials. Conventional Si-based PVDs generally have lower conversion efficiency than PVDs based on Ge or GaAs substrates (e.g., 10-15% vs. 20-40%). Si-based PVDs are less expensive to make than Ge or GaAs-based PVDs. PVDs built on Si substrates generally cost less than PVDs built on Ge or GaAs substrates. But PVDs built on Ge or GaAs substrates generally have higher performance (efficiency) than PVDs built on Si substrates.

The development of high-efficiency III-V compound solar cells grown on Si substrates is of particular interest for space and terrestrial PVDs. In comparison with GaAs and Ge, the currently the dominant substrates for III-V space photovoltaics, Si possesses far superior substrate properties with respect to mass density, mechanical strength, thermal conductivity, cost, wafer size and availability. However, the fundamental material incompatibility issues between III-V compounds and Si still represent a substantial hurdle for achieving high-performance Si-based III-V PV cells. These material incompatibility issues include lattice mismatch between III-V compounds and Si and a large mismatch in thermal expansion coefficiency. The high density of dislocations that occur at interfaces between Si and III-V compounds leads to low minority-carrier lifetime and results in low open-circuit voltages. To date, progress has been made in reducing GaAs dislocation density by employing various epitaxial schemes such as cycle thermal annealing, epitaxial lateral overgrowth, growth on compositional graded SiGe buffers, and insertion of strained layer superlattices. See, respectively, M. Yamaguchi, A. Yamamoto, M. Tachikawa, Y. Itoh and M. Sugo, Appl. Phys. Lett. 53 2293 (1998); Z. I. Kazi, P. Thilakan, T. Egawa, M. Umeno and T. Jimbo, Jpn. J. Appl. Phys. 40, 4903 (2001); M. E. Groenert, C. W. Leitz, A. J. Pitera and V. Yang, Appl. Phys. Lett. 93 362 (2003); and N. Hayafuji, M. Miyashita, T. Nishimura, K. Kadoiwa, H. Kumabe and T. Murotani, Jpn. J. Appl. Phys., 29, 2371 (1990), all incorporated by reference herein. Unfortunately, these methods generally require relatively thick transition layers—typically greater than 10 micrometers (μm)—before device quality materials are obtained, which is not viable for practical applications.

Aspect ratio trapping (ART) technology enables the growing of high quality lattice-mismatched materials such as Ge or GaAs (or other III-V materials) on Si substrates, as described in U.S. patent application Ser. Nos. 11/436,198, 11/728,032, and 11/852,078, all incorporated by reference herein. Using Si substrates and ART technology to provide relatively high quality Ge or GaAs layers allows for building PVDs that have the advantages of Si substrates (e.g., cost, manufacturing, thermal performance, radiation resistance, strength) as well as advantages of PVDs built using Ge or GaAs substrates (e.g., high efficiency).

An advantage of using ART for PV is that isolating ART regions from each other prevents the performance of a cell from being affected by a problematic neighboring cell, e.g., by recombination of electrons and holes due to defects. Another advantage of ART for PVs is that it allows the combination of two materials that have mismatched thermal expansion properties, such as Si and III-V materials. As with the trapping of defects in the ART region, expansion mismatch and associated challenges are confined to small areas.

In an aspect, embodiments of the invention feature a structure for use in photovoltaic applications. The structure includes a mask layer that is disposed above the top surface of a substrate. The mask layer includes a non-crystalline material, and has an opening extending from the top surface of the mask layer to the top surface of the substrate. A crystalline material may be disposed in the opening and may have a first region disposed above and proximal to a portion of the top surface of the substrate. A second region of the crystalline material, which may have substantially fewer defects than the first region, may be disposed above the first region and the top surface of the substrate. A photovoltaic cell may be disposed above the crystalline material.

One or more of the following features may be included. The substrate may include at least one of monocrystalline silicon, e.g., (111) silicon, polycrystalline silicon, or amorphous silicon. The substrate may include a material having a lattice mismatch with the crystalline material. The mask layer may include an oxide of silicon and/or a nitride of silicon, and may include first and second layers made of different chemical compositions. The crystalline material may include a III-V compound, e.g., a III-nitride material, a II-VI compound, or a group IV element or compound.

The photovoltaic cell may include one or more of a multi-junction photovoltaic cell, an active cell junction above and/or below the top surface of the mask layer, or an active cell junction below the top surface of the substrate. The active cell junction below the top surface of the substrate may have a shape corresponding to a shape defined by an intersection of the opening in the mask layer and the top surface of the substrate. The active cell junction below the top surface of the substrate may include a doped layer proximal to the top surface of the substrate. The active cell junction below the top surface of the substrate may include a doped layer proximal a bottom surface of the substrate. An electrical contact may be disposed on a bottom surface of the substrate.

The opening may define a generally circular shape and/or a generally rectangular shape on the top surface of the substrate. The shape may have a length less than about 1 micrometer or greater than about 1 millimeter, and a width less than or equal to about 1 micrometer. The distance from the top surface of the mask layer at the opening to the top surface of the substrate may be less than or greater than about 1 micrometer in height, and the height may be greater than the width. The length may be greater than twice the width, and the width may be between about 100 nanometers to about 1 micrometer, between about 10 nanometers and about 50 nanometers, or between about 50 nanometers and about 100 nanometers.

In another aspect, an embodiment of the invention includes a structure for use in photovoltaic applications. The structure includes a substrate and a mask layer disposed above a top surface of the substrate. The mask layer may include a non-crystalline material and may have a plurality of openings extending from a top surface of the mask layer to the top surface of the substrate. A crystalline material, which may be disposed in and above the plurality of openings, may have a portion disposed above the openings having substantially fewer defects than a second portion of the crystalline material disposed within the openings and adjacent to the top surface of the substrate. A photovoltaic cell may be disposed above the crystalline material.

In various embodiments, the crystalline material includes at least one of a III-V compound, a II-VI compound, or a group IV element or compound. The III-V compound may include a III-nitride material. The mask layer may include an oxide of silicon and/or a nitride of silicon. The photovoltaic cell may include an active cell junction below the top surface of the substrate and/or a multi-junction photovoltaic cell. The crystalline material may be disposed adjacent a top surface of the substrate, and an intermediate crystalline material may be disposed in the plurality of openings between the crystalline material and the substrate. At least one opening may define a generally circular shape on the top surface of the substrate, and the shape may have a length and a width, and the width may be less than about 1 micrometer. The length may be less than about 1 micrometer or greater than about 1 millimeter.

Each of the plurality of openings may have a height defined by the distance from the top surface of the mask layer to the top surface of the substrate, and each height may be less than or greater than about 1 micrometer. Each of the plurality of openings may define a shape on the top surface of the substrate, each shape may have a length and a width, and each width may be between about 100 nanometers and about 1 micrometer, between about 50 nanometers and about 100 nanometers, or between about 10 nanometers and about 50 nanometers. The length of each of the plurality of openings may be greater than twice the width of each of the plurality of openings. Each of the plurality of openings has a height defined by a distance from the top surface of the mask layer to the top surface of the substrate, and the height of each opening may be greater than or less than the width of each opening.

In yet another aspect, an embodiment of the invention includes a structure for use in photovoltaic applications. The structure includes a mask layer including a non-crystalline material, disposed above a top surface of a substrate. An opening may extend from a top surface of the mask layer to the top surface of the substrate, and may define a shape on the top surface of the substrate having a width less than about 1 micrometer and a length. A crystalline material may be disposed in the opening, and a photovoltaic cell, which may have at least one active cell junction having a width less than about 1 micrometer, may be disposed above the crystalline material.

One or more of the following features may be included. The length may be less than about 1 micrometer or greater than about 1 millimeter. The opening may have a height, which may be less than or greater than about 1 micrometer, defined by a distance from the top surface of the mask layer to the top surface of the substrate. The width may be between about 100 nanometers and about 1 micrometer, between about 50 nanometers and about 100 nanometers, or between about 10 nanometers to about 50 nanometers. The height may be greater than the width.

The photovoltaic cell may include a multi-junction photovoltaic cell, one or more active cell junctions disposed above and/or below the top surface of the mask layer, or an active cell junction disposed below the top surface of the substrate. The crystalline material may include at least one of a III-V compound, a II-VI compound, or a group IV element or compound, and the III-V compound may include a III-nitride material. The mask layer may include an oxide of silicon and/or a nitride of silicon. An intermediate crystalline material may be disposed in the plurality of openings between the crystalline material and the substrate. The intermediate crystalline material may include at least one of a III-V compound, a II-VI compound, or a group IV element or compound. The intermediate crystalline material may be disposed adjacent to or in the opening adjacent to the top surface of the substrate and may have a thickness sufficient to permit a majority of defects arising in the intermediate crystalline material near the top surface of the substrate to exit the intermediate crystalline material at a height below the top surface of the mask layer.

In still another aspect, an embodiment of the invention includes a structure for use in photonic applications. A mask layer is disposed above a top surface of a substrate and includes an opening extending from a top surface of the mask layer to the top surface of the substrate. A crystalline material may be disposed in the opening, and a photonic device, which may have an active junction including a surface that extends in a direction substantially away from the top surface of the substrate, may be disposed above the crystalline material.

One or more of the following features may be included. The surface of the active junction is substantially perpendicular to the top surface of the substrate. The opening may define a generally columnar shape or a shape on the top surface of the substrate having a length and a width, and the width may be approximately equal to the length, less than half the length, or less than one tenth the length. The photonic device may include one or more active junctions having a sidewall surface that extends substantially away from the top surface of the substrate and that may be coupled to a top surface. The active junction surfaces may be substantially perpendicular to the top surface of the substrate. Each active junction may include a sidewall surface extending in a direction substantially away from the top surface of the substrate and coupled to a top surface. Each active junction may include a portion adjacent the top surface of the mask layer, and the mask layer may electrically isolate each active junction from the substrate. A portion of the active junction may be adjacent the top surface of the mask layer and the mask layer may electrically isolate the active junction from the substrate.

The crystalline material may include a III-V compound, a II-VI compound, and/or a group IV element or compound. The III-V compound may include a III-nitride material. The top surface of the mask layer may be substantially optically reflective. An active cell junction may be disposed below the top surface of the substrate, and may include a doped layer proximal to the top and/or bottom surface of the substrate. The photonic device may include a photovoltaic device, a plurality of multi-junction photovoltaic devices, an LED, and/or a plurality of LEDs connected in parallel.

In another aspect, embodiments of the invention include a structure. A first semiconductor material, disposed on a substrate, includes a sidewall extending away from the substrate. A second semiconductor layer may be disposed on a portion of the sidewall to define an active device junction region. A mask layer, which may be disposed on the substrate adjacent to a bottom region of the sidewall, may electrically isolate the second semiconductor layer from the substrate.

One or more of the following features may be included. A third semiconductor layer may be disposed on the second semiconductor layer, and the mask layer may electrically isolate the third semiconductor layer from the substrate. The mask layer may define an opening, through which the first semiconductor material may be disposed on the substrate, having a sidewall extending a predefined height from a top surface of the mask layer to a top surface of the substrate. The opening may define a width and a length adjacent the top surface of the substrate, and the ratio of the height to the width may be greater or less than 1. The first semiconductor material may include at least one of a III-V compound, a II-VI compound, or a group IV element or compound, and the III-V compound may include a III-nitride material. The structure may include a photonic device, and the photonic device may include the active device junction region. The photonic device may include a photovoltaic device, a plurality of multi-junction photovoltaic devices, an LED, and/or a plurality of LEDs connected in parallel.

In still another aspect, embodiments of the invention include a structure. A first photonic device structure is disposed above a first region of a substrate and including a first top surface and a first uncovered sidewall surface. A second photonic device structure may be disposed above a second region of the substrate, may be spaced apart from the first structure, and may include a second top surface and a second uncovered sidewall surface. A conductive layer may extend from the first top surface of the first photonic device structure to the second top surface of the second photonic device structure, above the first and second uncovered sidewall surfaces of the first and second structures, to electrically couple the first and second top surfaces. The conductive layer may include aluminum (Al), silver (Ag), titanium (Ti), tin (Sn), chromium (Cr), and/or Si.

In another aspect, embodiments of the invention include a structure for use in photonic applications. A mask layer is disposed on a top surface of a substrate. The mask layer has a top surface, and a maximum height between the top surface of the substrate and the top surface of the mask of less than about 1 micrometer. A plurality of openings extend from the top surface of the mask to the top surface of the substrate, and may have a maximum width in one direction of less than about one micrometer. A crystalline material is disposed in each of the openings on the top surface of the substrate, and has a height sufficient to permit a majority of defects arising from the interface between the crystalline material and the substrate to exit the crystalline material below the top surface of the mask.

In yet another aspect, embodiments of the invention include a structure for use in photovoltaic applications. A photovoltaic device may be disposed on the top surface of the substrate, and may have a length and a width in a plane defined by the top surface of the substrate. The width may be approximately equal to a wavelength of light selected from a range of 300 nanometers (nm) to 1800 nm.

One or more of the following features may be included. The length may be approximately equal to a wavelength of light selected from a range of 300 nm to 1800 nm, and/or the length may be greater than 1 millimeter. The width may be approximately equal to 300 nm, to 1800 nm, or to a wavelength of light visible to a human eye selected from a range of about 300 nm to about 1800 nm. The photovoltaic device may include an active cell junction extending substantially away from the plane of the substrate.

In another aspect, embodiments of the invention include a structure for use in photonic applications. A plurality of spaced-apart photonic devices may be disposed within a device perimeter on a top surface of a substrate and may define a substrate surface area. The top surface may define a plane. Each photonic device may include an active device junction between two semiconductor materials defining an active junction surface area. The combined active surface areas of the plurality of photonic devices may be greater than the substrate surface area defined by the device perimeter.

The combined active surface areas of the plurality of photonic devices may be at least about 25% greater, 50% greater, 100% greater, 200% greater, or 400% greater than the substrate surface area defined by the device perimeter.

In another aspect, embodiments of the invention include a method of forming a structure for photonic applications. The method includes providing a non-crystalline mask over a top surface of a substrate. The mask may include a first layer disposed above and proximal to a portion of the top surface of the substrate and a second layer disposed above the first layer and above the portion of the top surface of the substrate, and the first and second layers may have a different chemical compositions. A crystalline material may be formed within an opening extending from a top surface of the mask to the top surface of the substrate to a height sufficient to permit the majority of defects arising near the interface of the crystalline material and the substrate to exit the crystalline material below the top surface of the mask layer. The second layer of the mask may be selectively removed, and a photonic device may be formed above the crystalline material.

One or more of the following features may be included. The first mask layer may include an oxide of silicon and the second mask layer may include a nitride of silicon. Forming the photonic device may include forming at least one of a multi-junction photovoltaic device or a light emitting device. The photonic device may have a width of less than about one micrometer, less than about 100 nanometers, selected from a range of about 100 nanometers to about 500 nanometers, or selected from a range of about 10 nanometers to about 100 nanometers. The first mask layer may include a substantially optically reflective material or a substantially optically transparent material.

In still another aspect, embodiments of the invention include a method of forming a structure for photonic device applications. A mask layer is provided adjacent a top surface of a substrate, including at least one opening extending through the mask layer to the substrate. An intermediate crystalline material may be formed in the at least one opening, and may have a sidewall and a top surface. The material having the top surface may have a height sufficient to permit a majority of defects arising from the interface between the substrate and the first crystalline material to exit the first crystalline material below the top surface. A crystalline material may be disposed on the intermediate crystalline material to create an active photonic junction that includes sidewall regions extending in a direction away from the top surface of the substrate.

One or more of the following features may be included. Providing the first crystalline material may include providing at least one of a III-V compound, a II-VI compound, or a group IV element or compound; the III-V compound may include a III-nitride material. Providing a mask layer may include providing first and second mask layers, and may further include removing the second mask layer after forming the first crystalline material in the at least one opening. The method may further include disposing at least one third crystalline material around the crystalline material to create a second active photonic junction including a sidewall region extending in a direction away from the top surface of the substrate. The intermediate crystalline material may include a columnar sidewall or a generally planar sidewall. The generally planar sidewall may have a height generally perpendicular to the substrate and a width perpendicular to the height, and the width may be at least twice the height, at least ten times the height, or at least one hundred times the height.

The method may further include forming a photonic cell that includes the active cell junction, forming a photovoltaic cell including the active cell junction, forming a multi-junction photovoltaic cell comprising the active cell junction, or forming an active cell junction below the top surface of the substrate. The photovoltaic cell may include an active cell junction disposed below the top surface of the substrate.

BRIEF DESCRIPTION OF FIGURES

In the drawings, like reference characters generally refer to the same features throughout the different views. Also, the drawings are not necessarily to scale, emphasis instead being placed upon illustrating the principles of the invention.

FIG. 1b is a schematic top view of openings disposed over a top surface of a substrate;

FIGS. 5a-5c are a schematic cross-sectional views of a photovoltaic device formed over a coalesced layer in a two-step epitaxy process including planarization;

FIGS. 6a-6b and 7a-7c are schematic cross-sectional views of devices formed over coalesced layers in which a crystalline material includes a material from the same group as a component of a substrate;

FIGS. 8a-8c and 9a-9d are schematic cross-sectional views illustrating processes combining homo-epitaxial and hetero-epitaxial growth;

DETAILED DESCRIPTION

A significant feature of embodiments of the present invention is the provision of a pathway to overcome the material incompatibility between lattice-mismatched materials, such as III-V compounds formed on a Si substrate. This approach is based on ART technology for selective epitaxy. See, e.g., U.S. patent application Ser. No. 11/436,062.

Figure 1A:
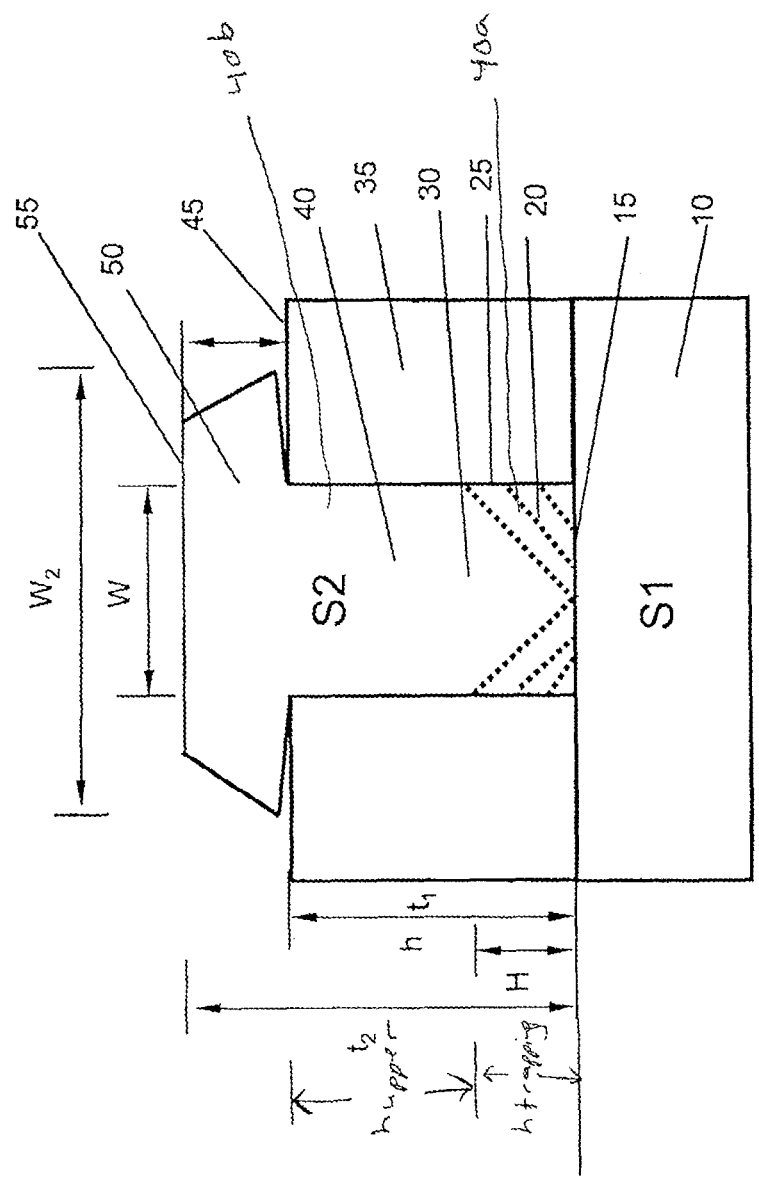
FIG. 1a is a schematic cross-sectional view of device formed by selective growth of a semiconductor material on a lattice-mismatched trenched surface by ART in accordance with an embodiment of the invention.

Referring to FIGS. 1a and 1b, an insulating material such as $SiO_2$, is used to define openings, e.g., trenches, above a semiconductor substrate. Semiconductor substrate may include, e.g., silicon. The openings are configured using ART techniques so that when a lattice-mismatched material, e.g., GaAs is epitaxially grown, defects in the lattice-mismatched GaAs layer are trapped in the lower region of the trenches and the GaAs region at the top of the trenches is relatively defect free.

More specifically, a substrate 10 includes a first crystalline semiconductor material S1. The substrate 10 may be, for example, a bulk silicon wafer, a bulk germanium wafer, a semiconductor-on-insulator (SOI) substrate, or a strained semiconductor-on-insulator (SSOI) substrate. The substrate 10 may include or consist essentially of the first semiconductor material S1, such as a group IV element, e.g., germanium or silicon. In various embodiments, substrate 10 includes or consists essentially of monocrystalline silicon, e.g., (111) silicon or p- or n-type (100) silicon; polycrystalline silicon; or amorphous silicon. In other embodiments, substrate 10 may include or consist essentially of a group IV compound, III-V compound or a II-VI compound.

A mask layer 35 is formed over the semiconductor substrate 10. The mask layer 35 may include or consist essentially of a non-crystalline material, such as dielectric material, e.g., a nitride of silicon like silicon nitride or an oxide of silicon like silicon dioxide. The mask layer 35 may be formed by any suitable technique, e.g., thermal oxidation or plasma-enhanced chemical vapor deposition (PECVD). As discussed below, the mask layer may have a thickness $t_1$ corresponding to a desired height h of crystalline material to be deposited in an opening 30, e.g., trench formed through the mask layer. In some embodiments, the thickness $t_1$ of the mask layer 35 may be selected from a range of, e.g., 25-1000 nm. In a preferred embodiment, the thickness $t_1$ is 500 nm.

A mask (not shown), such as a photoresist mask, is formed over the substrate 10 and the mask layer 35. The mask is patterned to expose at least a portion of the underlying mask layer 35. The exposed portion of the mask layer 35 is removed by, e.g., reactive ion etching (RIE) to define an opening 30, e.g., a trench. The opening 30 may be defined by at least one sidewall 25, and may extend to a top surface 15 of the substrate 10. The height h of the sidewall 25 corresponds to the thickness $t_1$ of the mask layer 35, and may be at least equal to a predetermined distance H from the top surface 15 of the substrate. The height h may be less than about 1 micrometer. In another embodiment, the height h may be greater than about 1 micrometer. The height h may be greater than the width w of the opening. The width w of the opening may be selected from a range of about 100 nanometers to about 1 micrometer, e.g., from a range of about 10 nanometers to about 50 nanometers, or from a range of about 50 nanometers to about 100 nanometers.

In an embodiment, the opening 30 is a trench that may be substantially rectangular in terms of cross-sectional profile, a top view, or both, and have a width w that is smaller than a length l (not shown) of the trench. For example, the width w of the trench may be less than about 500 nm, e.g., about 10-100 nm, and the length l of the trench may exceed each of w and H. A ratio of the height h of the trench to the width w of the trench 30 may be ≥0.5, e.g., ≥1.

In other embodiments, the opening 30 may define a generally circular shape or a generally rectangular shape on the top surface of the substrate. The opening may define a generally columnar shape. The opening 30 may have a length l and a width $w_3$, the width being less than or equal to about 1 micrometer. The length may be less than about 1 micrometer, or may be greater than about 1 millimeter. The length may be greater than twice the width, i.e., the width may be less than half the length. The width may be less than one tenth the length.

The opening 30 may be one of a plurality of openings 30.

A second crystalline semiconductor material S2, i.e., a crystalline material 40, is formed in the opening 30. The crystalline material 40 may include or consist essentially of a group IV element or compound, a III-V compound, or a II-VI compound. Examples of suitable group IV elements or compounds include germanium, silicon germanium, and silicon carbide. Examples of suitable III-V compounds include gallium antimonide, gallium arsenide, gallium phosphide, aluminum antimonide, aluminum arsenide, aluminum phosphide, indium antimonide, indium arsenide, indium phosphide, and their ternary or quaternary compounds. Suitable III-V compounds may include III-nitrides, such as gallium nitride, aluminum nitride, and indium nitride. Examples of suitable II-VI compounds include zinc selenide, zinc sulfide, cadmium selenide, cadmium sulfide, and their ternary or quaternary compounds.

In some embodiments, an intermediate crystalline material (not shown) may be disposed in the opening between the crystalline material 40 and the substrate, such that the intermediate crystalline material is disposed adjacent to the top surface of the substrate and has a thickness sufficient to permit a majority of defects arising in the intermediate crystalline material near the top surface of the substrate to exit the intermediate crystalline material at a height below the top surface of the mask layer.

The crystalline material 40 may be formed by selective epitaxial growth in any suitable epitaxial deposition system, including, but not limited to, metal-organic chemical vapor deposition (MOCVD), atmospheric-pressure CVD (AP-CVD), low- (or reduced-) pressure CVD (LPCVD), ultra-high-vacuum CVD (UHCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth temperature in the chamber may range from about 300° C. to about 900° C., depending on the composition of the crystalline material. The growth system may also utilize low-energy plasma to enhance the layer growth kinetics.

The epitaxial growth system may be a single-wafer or multiple-wafer batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or an EPSILON single-wafer epitaxial reactor available from ASM International based in Bilthoven, The Netherlands.

The crystalline material 40 may be lattice-mismatched to the substrate 10. In some embodiments, the crystalline material 40 is selected from a different group than the material of substrate 10. For example, substrate 10 may include a group IV element, e.g., Si, and the crystalline material 40 may include a III-V compound, e.g., GaAs.

In an exemplary process, a two-step growth technique is used to form high-quality crystalline material 40, e.g., consisting essentially of GaAs, in the opening 30. First, the substrate 10 and mask layer 35 are thermally annealed with hydrogen at approximately 1000° C. for approximately 10 minutes to desorb a thin volatile oxide from that substrate surface 15 that may be produced during pre-epitaxy wafer preparation. Chamber pressure during annealing may be in the range of approximately 50-100 torr, for example 75 torr. After annealing, the chamber temperature is cooled down with hydrogen flow. In order to suppress anti-phase boundaries (APDs) on substrate surface 15, a pre-exposure to As for about 1 to 2 minutes is performed. This step helps ensure uniform coverage of the trench surface with an As—As monolayer. This pre-exposure is achieved by flowing arsine ($AsH_3$) gas through the reactor at a temperature of approximately 460° C. Then, the precursor triethylgallium (TEG) or trimethylgallium (TMG) is introduced into the chamber together with $AsH_3$ gas at a higher growth temperature, e.g., approximately 500° C. to 550° C. promote the initial GaAs nucleation process on the As pre-layer surface. This high temperature process helps ensure that the Ga atoms are sufficiently mobile to avoid GaAs cluster formation. A slow growth rate of about 2 to 4 nm per minute with V/III ratio of about 50 may be used to obtain this initial GaAs layer, with a thickness in the range of about 10 to 100 nm.

Then a layer of n-type GaAs having a thickness of 1 to 2 μm is grown at a constant growth temperature of approximately 680° C. and a V/III ratio of approximately 200 to obtain defect-free GaAs material inside the opening 30. During this step, the crystalline material 40, i.e., GaAs epitaxial layer, may be formed such that its thickness $t_2$ may be greater than the dielectric mask thickness $t_1$. The crystalline material 40 may have a mushroom-type cross-sectional profile with lateral over growth over the mask layer 35; the top portion of the crystalline material 40 may coalesce with crystalline material formed in neighboring trenches (not shown) to form an epitaxial layer. A width $w_2$ of the crystalline material 40 extending over a top surface 45 of the mask layer 35 may be greater than the width w of the opening 30. In this case, a small void may be formed between the laterally grown crystalline material layer and the top surface 45 of the mask layer 35. The overall layer thickness $t_2$ of the crystalline material 40 may be monitored by using pre-calibrated growth rates and in situ monitoring equipment, according to methods known in the art.

Dislocation defects 20 in the crystalline material 40 reach and terminate at the sidewalls of the opening 30 in the dielectric material 35 at or below the predetermined distance H from the surface 15 of the substrate, such that dislocations in the crystalline material 40 decrease in density with increasing distance from the bottom portion of the opening 30. Accordingly, the upper portion of the crystalline material is substantially exhausted of dislocation defects. Various dislocation defects such as threading dislocations, stacking faults, twin boundaries, or anti-phase boundaries may be substantially eliminated from the upper portion of the crystalline material.

Thus, in some embodiments, the crystalline material 40 has a first region 40a disposed above and proximal to a portion of the top surface of the substrate 10 and a second region 40b disposed above the first region and above the portion of the top surface of the substrate, with the second region 40b having substantially fewer defects than the first region 40a. In other words, the crystalline material 40 may have two portions: a lower portion for trapping dislocation defects and an upper portion that either (i) incorporates the PV cell's epitaxial layers or (ii) serves as a template for the subsequent epitaxial growth of the PV cell's epitaxial layers. The height h of the crystalline material 40 thus has two components: the height $h_{trapping}$ of the lower portion (where defects are concentrated) and the height $h_{upper}$ of the upper portion (which is largely free of defects). The height $h_{trapping}$ of the trapping portion may be selected from a range of about $\frac{1}{2}w \leq h_{trapping} \leq 2w$, to ensure effective trapping of dislocation defects. The actual value of $h_{trapping}$ required may depend upon the type of dislocation defects encountered, which may depend on the materials used, and also upon the orientation of the trench sidewalls. In some instances, the height $h_{trapping}$ can be greater than that required for effective defect trapping, in order to ensure that the dislocation defects are trapped at a sufficient distance away from the upper portion, so that deleterious effects of dislocation defects upon device performance are not experienced. For example, $h_{trapping}$ may be, e.g., 10-100 nm greater than required for effective trapping of defects. For the upper portion, the height $h_{upper}$ may be selected from the range of approximately $\frac{1}{2}w \leq h_{upper} \leq 10w$.

Figure 4:
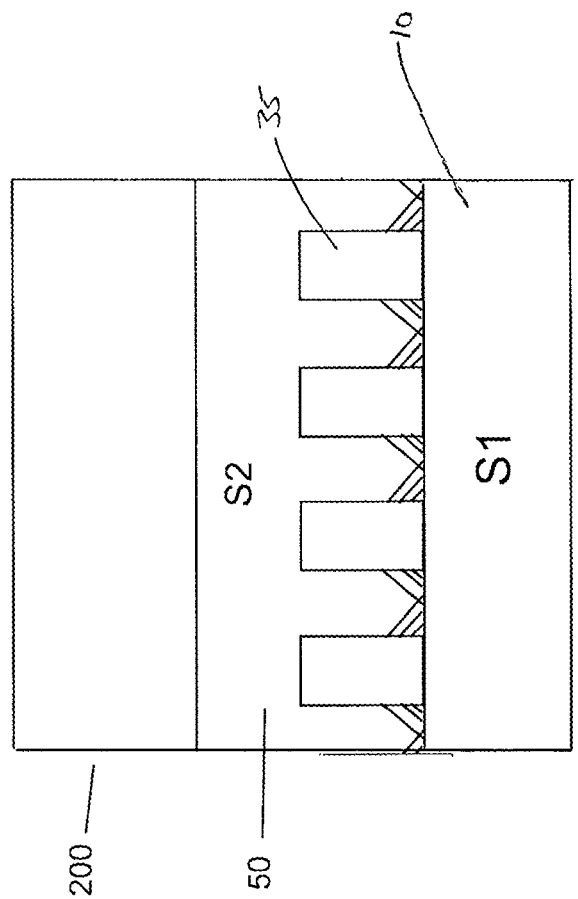
FIG. 4 is a schematic cross-sectional view of a photovoltaic device formed over a coalesced layer in a one-step epitaxy process.

In the embodiment of FIG. 1a and referring also to FIG. 4, epitaxial growth of the crystalline material 40 continues so that the crystalline material 40 within the opening 30 grows out and coalesces with crystalline material 40 formed in adjacent openings 30 to form a single contiguous crystalline material, e.g., GaAs, layer 50 above the openings in the mask layer. PVDs (also called referred to herein as "solar cells") are then built above the crystalline material using various materials and techniques as are known in the art. For example, see Ringel, et al., Single-junction InGaP/GaAs Solar Cells Grown on Si Substrates with SiGe Buffer Layers (Prog. Photovolt: Res. Appl 2002; 10:417-426 (DOI: 10.1002/pip.448)), Yamaguchi, et al., Super-high-efficiency Multi-junction Solar Cells (Prog. Photovolt: Res. Appl. 2005; 13:125-132 (DOI: 10.1002/pip.606)) and Yamaguchi, et al., GaAs Solar Cells Grown on Si Substrates for Space Use (Prog. Photovolt: Res. Appl. 2001; 9:191-201 (DOI: 10.1002/pip.366)), all of which are incorporated by reference herein in their entireties.

A planarization step such as, e.g., CMP may be used to planarize a top surface 55 of the contiguous crystalline material layer 50, to allow the formation of good quality films thereon. Alternatively, the top surface 55 may be left unplanarized, as a rough surface may be advantageous for capturing light in some devices.

By using ART techniques to trap defects that arise when epitaxially growing lattice-mismatched crystalline material over a substrate, e.g., forming a GaAs layer over a Si substrate, the top surface 55 of the crystalline layer has a suitably low defect level for building efficient PVDs with various materials for active PV regions, such as conventional III-V crystalline materials, III-nitride compounds or group IV-VI materials. PVDs built with these materials provide performance characteristics, such as efficiency and reliability that are superior to PVDs that use polycrystalline Si for active PV regions. The use of ART-configured openings to provide a relatively defect free top surface of crystalline material upon which to build PVDs is illustrative, and various other techniques are possible to provide a lattice-mismatched layer on a substrate that has a suitably low level of defects, such as, for example, other ART techniques disclosed in the references discussed above.

Figure 2:
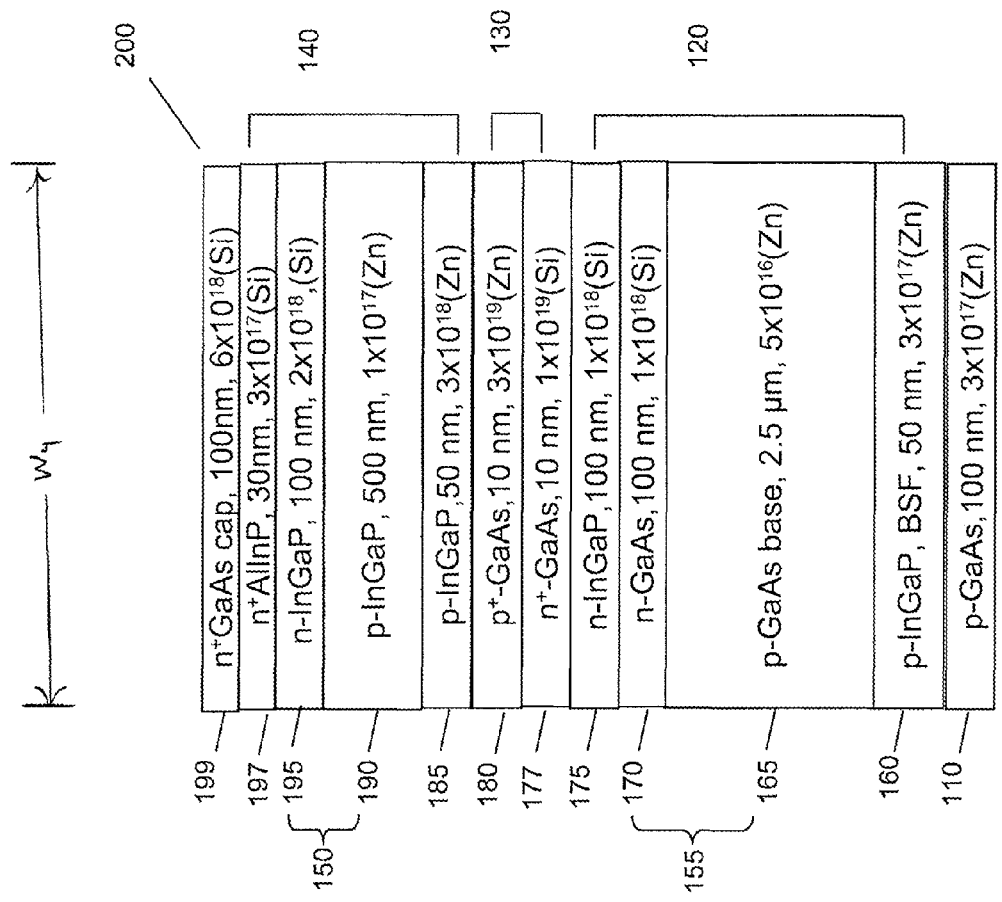
FIG. 2 is a schematic cross-sectional view of a two-junction solar cell module formed after coalescence growth in accordance with another embodiment of the invention.

Referring to FIG. 2, an exemplary photovoltaic cell is illustrated that may be formed over the structure including the crystalline material 40 discussed with reference to FIG. 1a. A photovoltaic cell, or photonic device, may be a two-junction solar cell device 200 including a starting template layer 110, a first (bottom) cell 120, a tunnel junction 130, and a second (top) cell 140. In use, when solar radiation strikes the solar cell device 200, the top cell 140 and bottom cell 120 each absorbs a portion of the solar radiation and converts the energy in the form of photons of the solar radiation to useable electric energy, measured in photovoltage and photocurrent. The illustrated two-junction solar cell device 200 is configured to absorb light in two incremental steps. Thus, photons in the received sun light having energy greater than the designed band gap of the active top cell, i.e., second cell 140 (e.g., greater than about 1.75 eV), will be absorbed and converted to electricity across semiconductor junction 150 or may pass through the tunnel junction 130 to the next cell, i.e., first cell 120. Photons having less energy than the designed band gap of the top second cell 140 (e.g., less than about 1.75 eV) will pass through the top cell 140 to the next active cell, i.e., first cell 120. Such lower energy sun light may be absorbed and converted to electricity across junction 155.

In an exemplary process, the solar cell device 200 may be formed as follows. Device 200 is formed by epitaxial structural growth on a template layer 110. This template layer may include crystalline material 40, e.g., either p-type or n-type GaAs (or Ge) planarized with CMP or a coalesced layer formed above a patterned mask layer 35, as discussed above with reference to FIGS. 1a and 1b. A back surface field layer (BSF) 160 including, e.g., p-InGaP, is formed over the template layer 110 for photon absorption enhancement. The solar cell device includes a GaAs base layer 165 disposed over the BSF layer 160 and having a thickness of about 2-3 μm, doped with a p-type dopant, such as zinc, to a concentration of about $1-3 \times 10^{17}/cm^3$. An emitter layer 170 of the first cell 120 may be n-type doped, e.g., GaAs doped with Si, to a concentration of about $1-2 \times 10^{18}/cm^3$ and may have a thickness of about 100 nm. A window layer 175 is formed over the emitter layer 65. The window layer 175 may include n-type InGaP doped with Si to a concentration of $1-2 \times 10^{18}/cm^3$, and may be grown to a thickness of about 100 nm. Window layer 175 is preferably an optically transparent layer that acts as an electrical barrier to avoid possible photocurrent backflow. The heavily doped tunnel junction 130, including n-type layer 177 and p-type layer 180, is used to facilitate the flow of photocurrent between top second cell 140 and first cell 120. The tunnel junction 130 may include a thin layer of any of a variety of materials that allow current to pass between first and second cells 120, 140 without generating a voltage drop large enough to significantly decrease the conversion efficiency of the device 200.

In the illustrated example, the top cell 140 is used for absorbing light with optical energy about 1.75 eV, and preferably includes a material lattice matched to GaAs, e.g., a ternary InGaP alloy. A desired band gap of top cell 140 may be realized by properly adjusting the compositional ratio of indium and gallium during InGaP growth. A p-type InGaP base layer 190 may have a thickness of about 500 nm and may be doped with zinc, to a concentration of $1-2 \times 10^{17}/cm^3$, and is disposed over a 50 nm thick bottom layer 185, which is doped to lower resistance, e.g., doped with zinc at a concentration of about $3 \times 10^{18}/cm^3$. Emitter layer 195 may include n-type InGaP with an n-type doping level of $1-2 \times 10^{18}/cm^3$ and a thickness of 100 nm. Window layer 197, disposed over layer 195, is thin enough to allow solar light pass through but thick enough to prevent photo-generated electron carrier recombination. Window layer 197 may include, e.g., a 30 nm thick AlInP window layer, doped with Si to a doping level of about $3 \times 10^{17}$. An n-type cap layer 199, e.g., GaAs doped with Si to a doping level of $6 \times 10^{18}$ with a thickness of about 100 nm, is used to form an ohmic contact. An electrical load (not shown) may be connected to the solar cell device 200 via grid electrical contacts on top of the solar cell device 200.

At least one active cell junction of the solar cell device may have a width $w_4$ less than about 1 micrometer in a plane defined by the top surface of the substrate. The width $w_4$ may be approximately equal to a wavelength of light selected from a range of 300 nm to 1800 nm, e.g., equal to 300 nm or 1800 nm. The width may be equal to a wavelength of light visible to a human eye. A length of the solar cell device may be approximately equal to a wavelength of light selected from a range of 300 nm to 1800 nm. The length may be greater than 1 millimeter. The solar cell device may include an active cell junction extending substantially away from the plane of the substrate.

Figure 3:
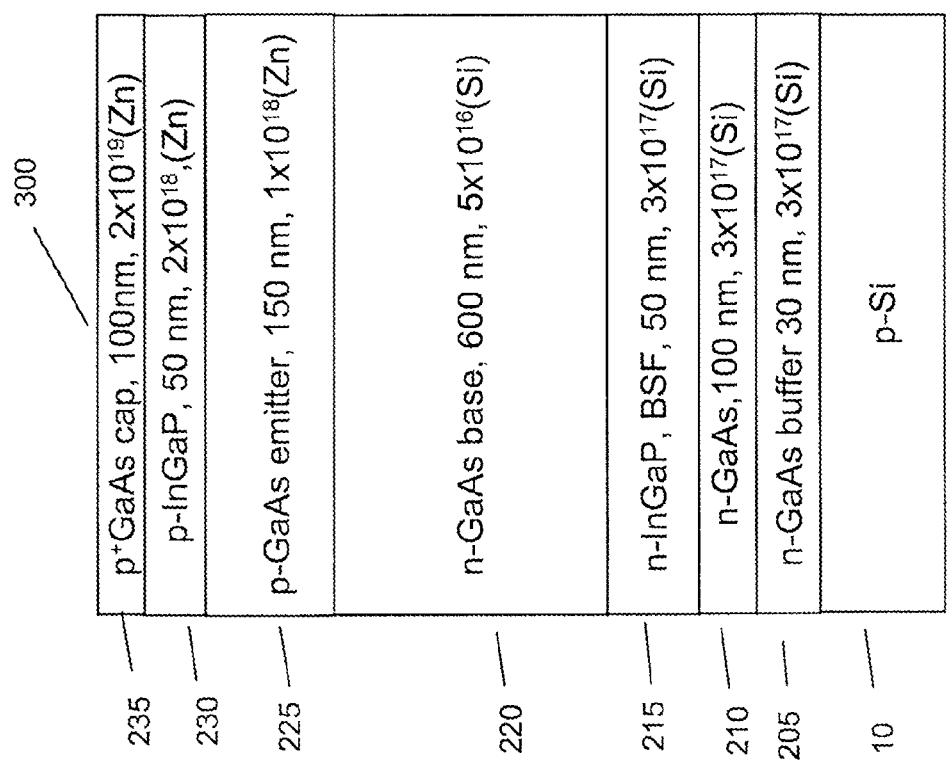
FIG. 3 is a schematic cross-sectional view of a one-junction solar cell module formed without coalescence growth in accordance with another embodiment of the invention.

FIG. 3 is a schematic cross-section drawing of another photovoltaic device that may be formed over crystalline material 40, i.e., a single solar cell device. Device 300 is a single cell structure, i.e., a cell element, confined within a micro-scaled dimension. It may be essentially completely fabricated within an opening in the mask layer 35 before coalescence growth occurs. This approach allows one to build micro- or submicrometer-scale PV cells (super lattice structure or quantum well configurations) inside localized defect-free area, which possesses advanced nano- or quantum-size characteristics in device performance.

Device 300 may be formed by epitaxy. In an exemplary process, prior to growth of device layers, a 500 nm $SiO_2$ film is thermally deposited on substrate 10, and 0.2-0.5 μm wide openings, e.g., along [110] direction of the substrate, are formed using conventional photolithography and RIE. Post-RIE, the patterned substrate is cleaned sequentially in Piranha, SC2, and diluted HF solutions. Near-surface damage to the Si crystal resulting from the RIE process may be reduced by a sacrificial oxidation and strip procedure. For example, a 25 nm sacrificial oxide layer may be formed on the surface including the openings, and subsequently removed by diluted HF prior to epitaxial growth. As a final component to the pre-epitaxial growth cleaning procedure, the patterned substrate may be thermally cleaned in an $H_2$ ambient at an elevated temperature, for example, 1000° C. for 10 minutes using a commercially available MOCVD reactor at 70 torr.

In an embodiment, device 300 is formed as follows. An n or p-type GaAs buffer layer 205 is epitaxially grown at about 400° C. followed by the growth of a high temperature transition layer 210 at 700° C. The growth rates may be 7 nm/minute for the buffer layer 205 and 50 nm/minute for the transition layer 210. A back surface field layer 215 for enhancing solar light photo absorption, e.g., an n-type InGaP layer with a thickness of 50 nm, may be grown under the same temperature, doped with Si with a doping level of $3\times10^{17}/cm^3$. A GaAs base layer 220, with a thickness of, e.g., 300-600 nm, depending on oxide layer thickness, is grown with a slightly n-type doping concentration of Si of $5\times10^{16}/cm^3$, followed by the formation of an emitter layer 225. Emitter layer 225 may have a thickness of 150 nm and may include GaAs with a p-type concentration of Zn of about $1\times10^{18}/cm^3$. Similarly to the process described with respect to FIG. 2, a top window layer 230 and a cap layer 235 for making ohmic contact are grown to finish the cell structure. In particular, the top window layer 230 may be a p-type InGaP layer doped with Zn to a doping level of $2\times10^{18}/cm^3$.

The single cell structure illustrated herein is a simple model. The essential concept it provides may be used to derive various alternative structures, such as multi-junction submicrometer PV cells, submicron or nano-scale 2-D and 3-D III-V/Si solar cells.

The exemplary modules illustrated in FIGS. 2 and 3 and variations thereof may be used in all of the following described embodiments of the invention. To simplify the description, the two-junction solar cell device 200 shown in FIG. 2 is used to illustrate the structures shown in FIGS. 4-10 and 15-17 and the single solar cell device 300 shown in FIG. 3 is used to illustrate the structures shown in FIG. 11-14.

Epitaxial growth of the exemplary cell structures shown both in FIGS. 2 and 3 is preferably performed using conventional MOCVD growth methods. Appropriate metal organic precursors include TMG, TEG, trimethylindium (TMIn) and trimethylaluminum (TMA). Hydride precursors include phosphine and arsine. Typical materials that may be used as conductivity dopants in III-V materials are zinc, cadmium, magnesium, carbon, selenium and silicon. Since carbon is a p-type dopant for GaAs but an n-type donor for InP, use of zinc as a p-type dopant for both GaAs and InGaP cells may be preferable to prevent heterointerface mixing during monolithic structural growth between GaAs and InGaP layers. The growth temperature for devices 200 and 300 are varied within the range of approximately 580-720° C., depending on individual growth reactor design.

Referring to FIG. 4, in a one-step epitaxial growth process, coalesced contiguous crystalline material layer 50 is grown to a sufficient thickness above the substrate 10 so that the surface roughness and defect levels of the coalesced contiguous crystalline material layer 50 are suitable for constructing solar cell devices 200 thereon without any need for an additional planarization step. For example, the surface roughness may be less than 100 nm, and the defect level may be less than $10^6/cm^2$ with the thickness $t_3$ of the coalesced contiguous crystalline material layer 50 being, e.g., 2 micrometers.

Referring to FIGS. 5a-5c, in a two-step epitaxy process, after growing the crystalline material 40 to a predetermined thickness to define coalesced contiguous crystalline material layer 50 (FIG. 5a), a top surface of the coalesced layer 50 may be planarized by, e.g., CMP (FIG. 5b). This method may allow the formation of a device with a thinner underlying crystalline layer than that of a device made in accordance with the embodiment illustrated in FIG. 4. Referring to FIG. 5c, after the planarization step, in a second step, an additional layer 500, e.g., a regrowth layer including a crystalline material of the same type as the contiguous crystalline material layer 50, is regrown on top of the planarized crystalline material surface before fabrication of PVDs thereover.

The crystalline material 40 may include a material from the same group as a component of the substrate. Referring to FIG. 6a, for example, crystalline material 40 may include Ge grown in the ART-configured openings 30 defined by mask layer 35, e.g., $SiO_2$, above substrate 10 consisting essentially of Si. The height of the Ge is less than the height of the $SiO_2$ openings but, based on ART techniques, the height is sufficient for the top surface of the Ge layer to be relatively defect free. Referring to FIG. 6b, GaAs may then be grown above the Ge to create a coalesced contiguous crystalline material layer 50 consisting essentially of GaAs that is a suitable base for growing or depositing subsequent layers for PVD devices 200. As discussed with respect to the embodiment of FIG. 5, the GaAs contiguous crystalline material layer 50 may be planarized and regrown. The lattice-constant of Ge is relatively close to the lattice constant of GaAs, thereby reducing the density of stress-related defects in the GaAs.

Referring to FIG. 7a, in another embodiment, two growth steps are combined with planarization. Crystalline material 40, e.g., Ge, is epitaxially grown above the ART-configured openings 30 defined in masking layer 35 to form contiguous crystalline material layer 50. Referring to FIG. 7b, a planarization step, e.g., a CMP step is performed to planarize the surface of the coalesced crystalline material layer 50. Referring to FIG. 7c, a regrowth layer 700 including, e.g., GaAs, is subsequently epitaxially grown on the planarized surface of the Ge contiguous crystalline material layer 50. The regrowth layer 700 provides a foundation for the formation of PVDs 200.

In some embodiments, the masking layer 35 may be removed during processing, and additional crystalline material may be grown in the resulting openings. Referring to FIG. 8a, in a two step homo-epitaxial process, crystalline material 40, e.g., a III-V compounds such as GaAs, may be grown over substrate 10, e.g., Si, in openings 30 using ART techniques, such that defects in the crystalline material 40 exit at the sidewalls of the mask layer 35, e.g., $SiO_2$. Then, as shown in FIG. 8b, the mask layer is selectively removed down to the substrate 10 to create new openings 30' between the GaAs crystalline material 40 regions. Referring to FIG. 8c, additional GaAs crystalline material 40 is deposited over the substrate 10 and the already present GaAs crystalline material 40 so that the crystalline material 40 coalesces to form contiguous crystalline material layer 50 of a suitable thickness for use as a base layer for the formation of PVDs 200. As discussed with respect to other embodiments, the GaAs contiguous crystalline material layer 50 may optionally be planarized, followed by optional regrowth, before the formation of PVD 200.

Similarly to the method illustrated in FIGS. 8a-8c, FIGS. 9a-9d illustrate an alternative method in which crystalline material 40 and the substrate 10 each may include a group IV material. Referring to FIG. 9a, a group IV material, e.g., Ge, is grown in openings 30 of a mask layer 35 over a Si substrate 10 using ART techniques. As shown in FIG. 9b, the mask layer 35 is then removed to create new openings 30' between the Ge regions. Referring to FIGS. 9c and 9d, either a III-V compound such as GaAs or a group IV material such as Ge, respectively, is grown over the existing crystalline material 40 and openings 30' to create a coalesced contiguous material layer 50 of GaAs or Ge. The GaAs layer provides a suitable base layer for PVDs 200. In the case of a coalesced Ge layer 50, after optional planarization, a III-V material such as GaAs (not shown) may be grown to provide a suitable base layer for PVDs. The growth of high quality Ge or GaAs layers such as the coalesced layers in FIGS. 8 and 9 provide virtual Ge or GaAs wafers atop a Si substrate, which may be useful in various applications in addition to PVD applications, such as light emitting devices or laser diodes.

Figure 10:
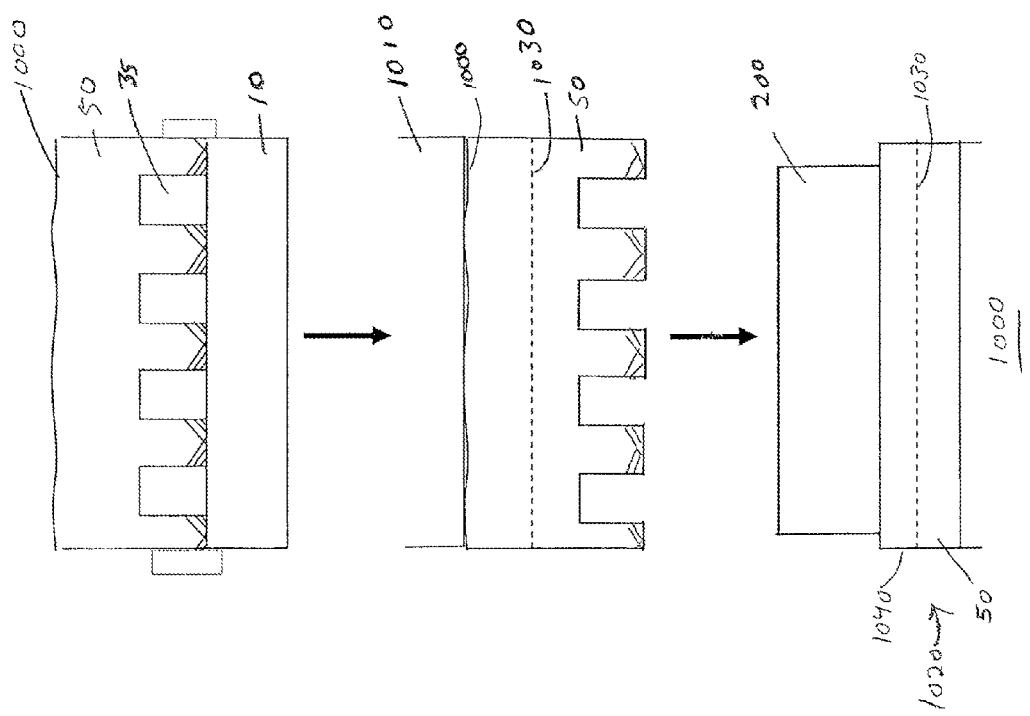
FIG. 10 is a schematic cross-sectional view illustrating a method for forming a virtual wafer by bonding.

Referring to FIG. 10, bonding may be used to create a virtual wafer suitable for applications such as PVDs. The first step is the growth of coalesced contiguous crystalline material layer 50 including, e.g., Ge or GaAs, in windows in a mask layer 35 disposed over a first substrate 10, such as by the ART techniques discussed above and illustrated in FIGS. 5 and 7. Then a top surface 1000 of contiguous crystalline material layer 50 is wafer bonded, after an optional planarization step, to a second substrate 1010, e.g., a Si or Si on insulator (SOI) or other compatible wafer platform. A virtual Ge or GaAs wafer 1020 is created atop the second Si or SOI substrate 1010 by removing the Si and $SiO_2$ from the first Si wafer and then using CMP to planarize the exposed bottom surface 1030 of the Ge or GaAs layer. This virtual wafer 1020 may be further processed, e.g., with growth of an additional layer 1040 of e.g., a III-V compound such as GaAs, to create a base for PVDs 200, or the virtual wafer 1020 may be used in other applications that require or benefit from a relatively thin, larger size, high quality Ge or GaAs layer disposed atop suitable template.

Figure 11:
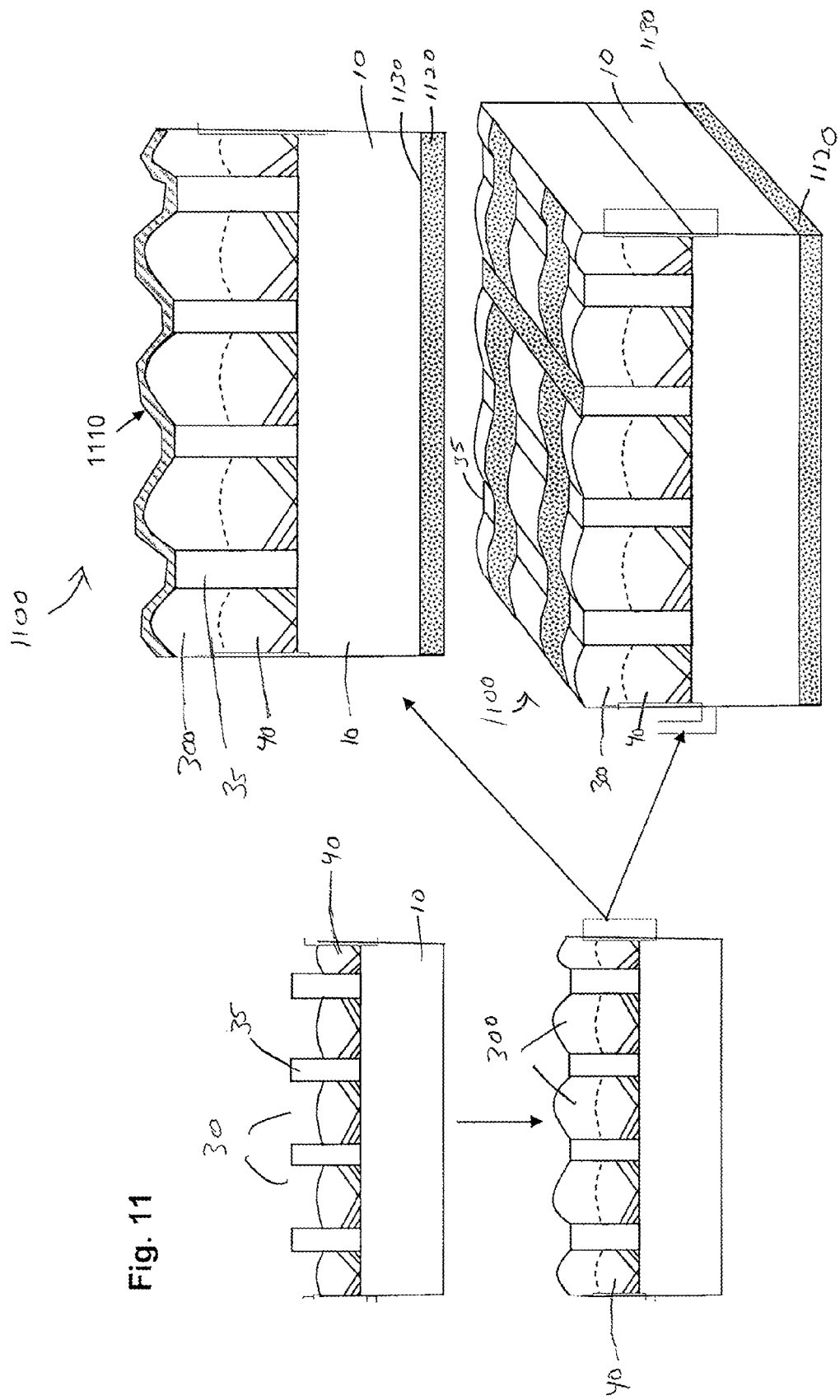
FIGS. 11-13 are schematic cross-sectional views illustrating the formation of arrays of PVDs.

Referring to FIG. 11, an array 1100 of PVDs may be built by use of a two-step heteroepitaxy process. Each PV cell may include the exemplary cell structure illustrated in FIG. 3 as device 300. Openings 30 are defined in a mask layer 35 disposed over on substrate 10 using ART techniques. The openings 30 may be configured as trenches. A layer of crystalline material 40, e.g., Ge, is grown at the bottom of the trenches to a height that allows defects to exit at the sides so that the top surface of the crystalline material 40 has a low level of defects. Then layers are sequentially grown above the Ge layer within the trenches to create PV devices 300.

Note that while FIG. 11 illustrates an array of elongated PVDs grown in trenches, ART techniques enable a wide variety of configurations for arrays of PVDs, such as arrays including PVDs formed as columns with circular cross-sections or as posts with square cross-sections. ART techniques also enable a wide variety of dimensions for the elements in PVD arrays. For example, a trench can be configured to be several millimeters long with a width on the order of one or two micrometers or smaller. Decreasing the width of an ART opening can decrease the height below which most defects are trapped, enabling the use of masks having thicknesses of about less than one micrometer, although in some embodiments a mask thickness in excess of one micrometer will be advantageous. Other embodiments can take advantage of sub-micrometer widths, such as a trench having a width in the range of 100 nanometers to 1 micrometer, or between 50 and 100 nanometers, or between 10 and 50 nanometers, or even smaller than 10 nanometers, or openings to create columns or posts with a maximum dimension (parallel to the substrate) of less than one micrometer, or less than 100 nanometers, or even less than 50 or 10 nanometers. Also, decreasing widths permits decreasing mask thicknesses.

In constructing the PV devices 300, an exemplary sequence of layers includes the growth of an n-type GaAs buffer layer above an n-type Ge layer in the trenches, followed by the growth of an n-type InGaP BSF layer, an n-type GaAs base layer, a p-type GaAs emitter layer, a p-type InGaP layer, and a p-type GaAs cap layer. For multi-junction cells, an exemplary sequence of layers may include the growth of an n-type Ge layer above a p-type Ge layer to create a bottom cell, followed by the growth of an n-type InGaAs buffer layer, an n-type InGaP layer, and a p-type AlGaAs layer to create a tunnel junction. Subsequently, a p-type InGaP layer, a p-type InGaAs layer, an n-type InGaAs layer, and an n-type AlInP layer are grown to create a middle cell. An n-type InGaP layer and a p-type AlGaAs layer define another tunnel junction. Finally, a p-type AlInP layer, a p-type InGaP layer, an n-type InGaP layer, and an n-type AlInP layer are formed to create a top cell. In some embodiments, an active cell junction may be disposed above a top surface of the mask layer. In other embodiments, the active cell junction may be disposed below the top surface of the mask layer. In still other embodiments, the active cell junction may be disposed below the top surface of the substrate. The materials used to create cells and tunnel junctions, parameters such as doping levels and layer thicknesses, and materials for use as antireflective coatings and top contacts may be varied in accordance with methods known to those of skill in the art.

The length of PVDs built using the trenches may vary and be relatively long, for example extending virtually from edge to edge of a wafer. By using suitably narrow nanoscale trenches, the PVDs can provide a nanowire-type configuration of individual PVDs in an array that can be of a flexible size and shape. The PVD cells or elements within an array may be electrically interconnected with contacts 1110 formed from any of a variety of materials such as ITO, and in a variety of configurations as desired, for example in parallel as shown in the embodiment illustrated in FIG. 11. In alternative embodiments, some sub-arrays of PVD elements may be connected in parallel and other sub-arrays in series.

The height and width of PVDs may vary based on materials and design parameters. For the first exemplary sequence of layers for PV devices 300 discussed above, for example, the height may be selected from a range of approximately 0.5-3 micrometers and the width may be selected from a range of approximately 0.5-2 micrometers.

By configuring the width of PVDs built in the trenches to be wider than the width of the mask layer portions used to define trenches, a PVD array may cover more than half the area of a substrate upon which the array is formed. The trench and mask widths may be varied, and a wide variety of materials may be substituted to create the active regions of PVDs to create PVDs and PVD arrays with desired performance characteristics.

In the embodiment of FIG. 11, one option for the top contact 1110 for PVDs is to deposit an optically transparent and electrically conductive material layer, such as ITO. As an alternative to using ITO, another option for connecting PVDs is the use of metal contact wires to connect multiple PVDs in parallel. In both illustrated contact options, a bottom contact 1120 for the PVDs is provided on a bottom surface 1130 of the substrate 10. The substrate 10 is suitably doped such that an electrical path is formed from the bottom of the PV devices 300 through the crystalline material 40 and substrate 10. As illustrated in other embodiments, wafer thinning may be applied to the substrate 10 to reduce PV cell photocurrent resistance.

Figure 12:
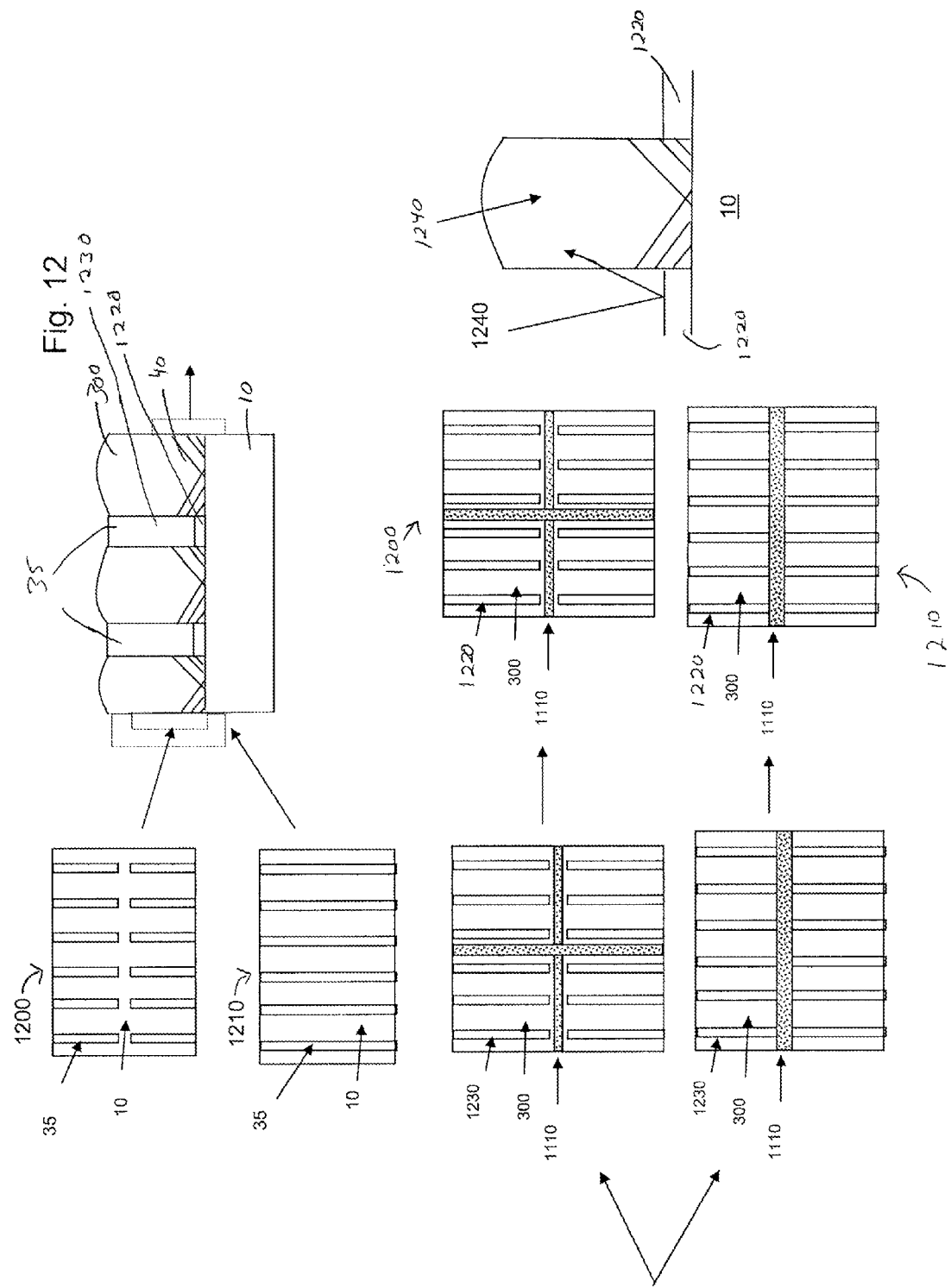

Alternative methods and configurations may be used to provide sub-micrometer PVD arrays. Referring to FIG. 12, ART-configured openings 30 configured as trenches are defined by a mask layer 35 over substrate 10. The openings 30 may define any of a number of patterns, such as a ribbing-type pattern 1200 or a finger-type pattern 1210. The mask layer 35 may be a compound mask having a first mask layer 1220 and a second mask layer 1230, with a chemical composition of the first layer being different from a chemical composition of the second layer. For example, the second mask layer may include $SiO_2$ formed above the first mask layer including $SiN_x$ disposed above a Si substrate 10. Using the same techniques as discussed above with reference to FIG. 11, crystalline material 40 and PVD device 300 layers are grown in the trenches, and contacts 1110, e.g., metal contacts, are defined. In an embodiment, the second layer 1230 of the compound mask layer 35, i.e., $SiO_2$, is selectively removed after formation of the PVDs 300 to expose the first layer 1220 of the compound mask layer, e.g., the $SiN_x$ layer that provides a reflective surface between the PVDs, so that photons 1240 that fall between the PVD nanowires will be reflected back and captured for conversion to electricity.

Those of skill in the art will appreciate that different materials may provide a reflective surface between the PVD elements. When creating the reflective surface, such as by deposition of a material layer, the surface can be faceted or otherwise configured to direct photons towards the PVDs so that a PVD nanotrench array that only covers about 50% of the surface of the substrate can still capture over 90% of the photons that strike the area defined by the perimeter of the array. PVD arrays may be configured to effectively capture the same percentage of photons as conventional PVDs that have no gaps within their outer perimeter.

The illustrated array may include a plurality of spaced-apart photonic devices disposed within a device perimeter on the top surface of the substrate defining a substrate surface area, with each photonic device including an active device junction between two semiconductor materials defining an active junction surface area, the combined active surface areas of the plurality of photonic devices being greater than the substrate surface area defined by the device perimeter. For example, the combined active surface areas of the plurality of photonic devices may be at least about 25% greater than the substrate surface area defined by the device perimeter. In some embodiments, the combined active surface areas of the plurality of photonic devices may be at least about 50%, 100%, 200%, or 400% greater than the substrate surface area defined by the device perimeter.

As mentioned briefly above, in one variation of the embodiment illustrated in FIG. 12, a finger-type mask pattern 1210 is used so that each nanowire element of the PVD array has a distinct perimeter completely separated from other elements. In another variation, a ribbing-type mask pattern 1200 is used so that the nanowires are connected to each other in a transverse direction. In the finger-type configuration, a top PVD contact 1110 is created by depositing a metal contact layer transversely across the top of the PVD array elements before removing the $SiO_2$ layer to expose the underlying $SiN_x$ layer. In the ribbing-type configuration, a top PVD contact 1110 is created by depositing metal contact layers over the top of the PVD array in areas not covered by the mask, in this case in directions both parallel and transverse to the PVD array elements. Those of skill in the art shall readily recognize how to configure a suitable number of contact wires depending on the size and configuration of a PVD array.

Figure 13:
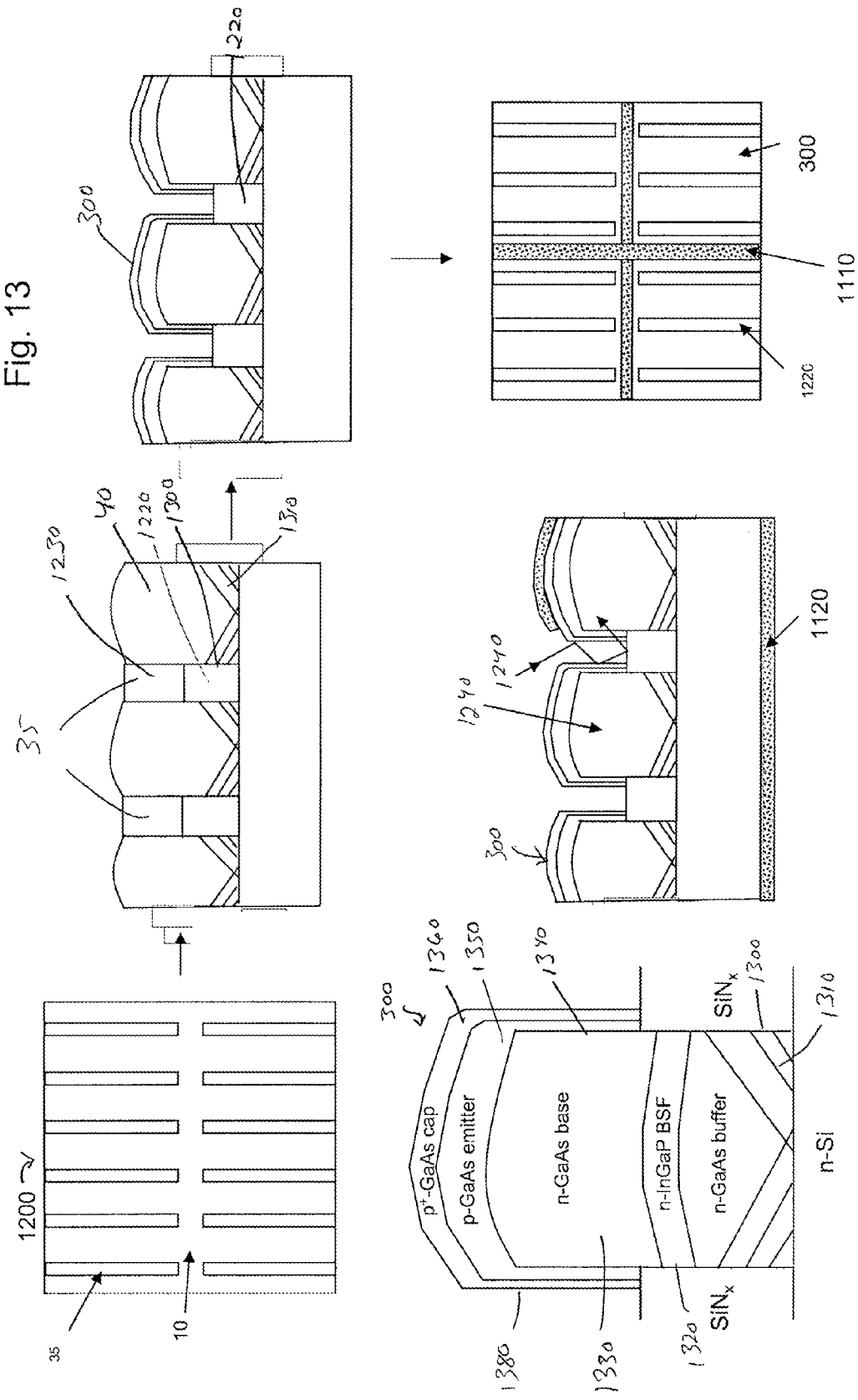

Referring to FIG. 13, an alternative structure is formed by using a mask layer 35, including a second mask layer 1230 of $SiO_2$ disposed above a first mask layer 1220 of $SiN_x$ to define trenches in a ribbing-type pattern 1200 using ART techniques. The first layer 1220 ($SiN_x$) is sufficiently thick, e.g., about 300 nm, such that the majority of defects arising from lattice-mismatch of the crystalline material 40 grown in the trench, e.g., GaAs, exits at the sidewalls 1300 of the $SiN_x$ layer. In the illustrated embodiment, the second layer 1230 ($SiO_2$) of the mask layer 35 is removed prior to the deposition all of the layers to create the PVD cell elements 300, resulting in PVD cells that have boundary layers with both vertical and horizontal portions. Top and bottom contacts 1110, 1120 are subsequently formed.

In the example of FIG. 13, a single-junction cell element 300 has an n-GaAs buffer layer 1310 deposited on an n-type Si substrate 10 within the ART-configured trench. The majority of defects arising from lattice mismatch between the GaAs buffer layer 1310 and the Si substrate 10 exit at the sidewall 1300 created by the $SiN_x$ layer so that the top surface of the buffer layer is substantially free of defects. An n-InGaP BSF layer 1320 and n-GaAs base layer 1330 are then deposited over the buffer layer 1310 in the trench prior to removal of the SiO$_2$ layer 1230 of the mask layer 35. After removal of the SiO$_2$ layer, the base layer includes exposed sidewalls 1340. InGaP is preferably used for BSF layer 1320 because it has a wider band gap than GaAs, and has an enhanced lateral growth tendency in comparison to GaAs. BSF layer 1320 provides an electrical barrier layer for reducing undesired current back flow, reflects higher energy photons back for photon recycling, and improves initial facet orientation for GaAs grown on the InGaP.

A p-type GaAs emitter layer 1350 and a p$^+$-GaAs cap layer 1360 are then deposited over the n-GaAs base layer 1330. By configuring the p-n junctions of the PVD cell element 300 to have both a top surface 1370 and lateral sidewall surfaces 1380, the p-n junction interface surface area can exceed the surface area of the Si substrate covered by the PVD array, for example, by 50%, 100%, or 200% or more, providing efficiency advantages over PVDs that have smaller p-n junction surface areas. While the embodiment of FIG. 13 illustrates a single-junction PVD cell, those of skill in the art will readily recognize how to construct multi-junction cells, such as the configuration discussed above with reference to FIG. 11.

The electrical contacts for the PVD array of FIG. 9 are provided by, e.g., an n-type metal contact layer formed on the bottom of the n-type Si substrate and an array of p-type metal contacts provided atop the PVD cell elements. While a ribbing-type mask pattern 1200 is shown in FIG. 13, such that the p-metal contacts are provided atop the PVD cell elements in directions both parallel and transverse to the trenches, an alternative is to use a finger-type mask pattern 1210 as discussed above with reference to FIG. 12.

Figure 14:
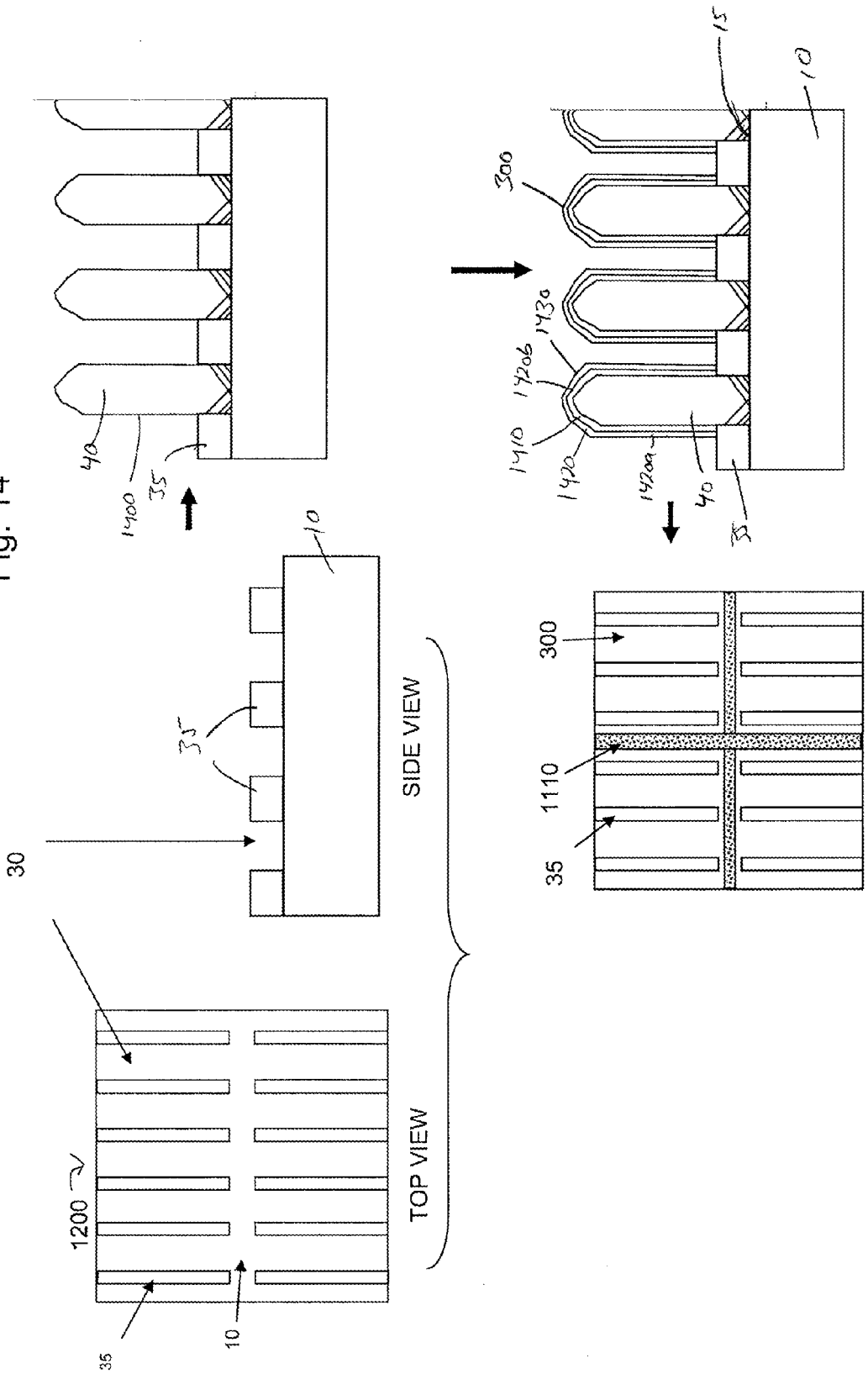
FIG. 14 is a cross-sectional view illustrating the formation of an array of PVDs on a Si(111) substrate.

Referring to FIG. 14, in an embodiment of the invention, a crystal orientation of an underlying substrate is used to control the configuration of crystalline material formed thereover. For example, one may start with a (111) Si substrate 10. Here, a ribbing-type mask pattern 1200 is used with an SiO$_2$ masking layer to define trenches. Those of skill will appreciate how to substitute or include other mask configurations and materials such as the finger-type configuration and SiN$_x$ mask material. By using techniques to control growth conditions to limit growth of sidewalls in the <110> direction, PVD cell elements 300 may be grown substantially vertically above the mask layer 35. It is known, for example, how to grow narrow pillars of a first semiconductor material above small mask openings on a wafer including the same material, e.g., how to grow GaAs above small mask openings on a GaAs wafer. See, e.g., Hamao et al., JJAP 36, L236 (1997) and Noborisaka et al., APL 86, 213102 (2005), incorporated herein by reference in their entireties. For example, when using MOCVD with a precursor of AsH$_3$, the growth rates of the (111) surface and (110) surface are highly dependent on substrate temperature (T$_s$) and partial pressure of the precursor (P$_{AsH3}$) during MOCVD epitaxy. See e.g., S. Ando et al., JCG 145, 320 (1994), incorporated herein by reference in its entirety, and Hamao, et al. At higher T$_s$ and lower P$_{AsH3}$, growth is faster on the (111) plane, so the crystalline material 40 may be formed with (110) sidewall facets. In order to promote growth on (110) planes to form a second semiconductor layer, such as second semiconductor layer 1410 discussed below, a reversed set of growth parameters may be used, with a lower substrate temperature T$_s$ and a relatively higher P$_{AsH3}$.

By adapting such growth techniques for hetero-epitaxial growth of III-V materials on a (111) Si substrate, it is possible to grow materials substantially vertically and trap dislocations on the sidewalls during vertical growth. For example, aligning the openings or trenches 30 along a <110> direction of the (111) substrate takes advantage of the slow growth on the (110) face of a sidewall 1400 of the epitaxially grown crystalline material 40. This asymmetric growth technique may be applied to structures other than pillars, such as fins or nanowires that have one narrow dimension and one long dimension.

The mask layer 35 may define openings 30, e.g., configured as trenches, through which the first crystalline material 40 is formed on the substrate 10, the opening having a sidewall extending a predefined height from a top surface of the mask layer to a top surface of the substrate, the opening defining a width and a length adjacent the top surface of the substrate. The ratio of the height to the width may be greater than 1. In other embodiments, the ratio of the height to the width may be less than 1.

After controlled vertical growth of one type of PVD cell layer, for example, a first semiconductor crystalline material 40, such as an n-type GaAs base layer, growth of subsequent cladding layers, for example, starting with a second semiconductor layer 1410 of, e.g., a p-type GaAs emitter layer, can be promoted on the sidewalls of, e.g., the base layer, in the <110> direction to define an active device junction region. Contacts 1110 may be formed over the PVD cell structures 300.

Techniques such as this can be used to create PVD cells with p-n junction surface areas that greatly exceed the surface substrate surface area covered by the PVD array, for example, by more than 100% or 200%. The PVD cell structure 300, i.e., photonic device, formed by this method includes an active junction 1420 having a surface that extends in a direction substantially away from the top surface 15 of the substrate 10, e.g., in a direction substantially perpendicular to the substrate top surface. The active junction may include a sidewall surface 1420*a* coupled to a top surface 1420*b*, the sidewall surface extending substantially away from the top surface 15 of the substrate 10.

A portion of the active junction may be adjacent the top surface of the mask layer, and the mask layer may electrically isolate the active junction from the substrate. The mask layer may also isolate a third semiconductor layer 1430 disposed on the second semiconductor layer 1420 from the substrate 10. The top surface of the mask layer may be substantially optically reflective.

The active cell junction may be disposed below a top surface of the substrate. The active cell junction may have a shape corresponding to a shape defined by the intersection of the opening in the mask layer and the top surface of the substrate. The active cell junction may include a doped layer proximal to the top surface of the substrate, or a doped layer proximal a bottom surface to the substrate.

The photonic device may include, e.g., a photovoltaic device, a plurality of multi-junction photovoltaic devices, a light-emitting diode (LED), or a plurality of LEDs connected in parallel.

As illustrated in FIGS. 11-14, a device may include a first photonic device structure disposed above a first region of a substrate, the first photonic device structure including a first top surface and a first uncovered sidewall surface, and a second photonic device structure disposed above a second region of the substrate and spaced apart from the first structure, the second photonic device structure including a second top surface and a second uncovered sidewall surface. A conductive layer may extend from the first top surface of the first photonic device structure to the second top surface of the second photonic device structure above the first and second uncovered sidewall surfaces of the first and second structures to electrically couple the first and second top surfaces. The conductive layer may include a material such as, for example, Al, Ag, Ti, Sn, Cr, and/or Si.

Figure 15:
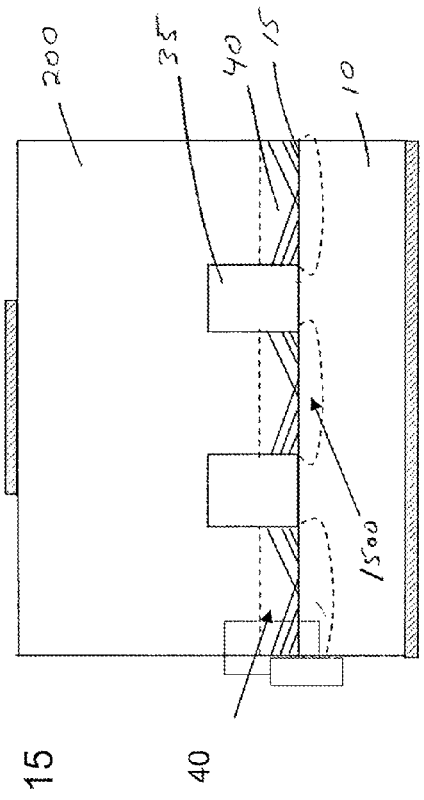
FIGS. 15-17 are schematic cross-sectional views illustrating alternative features that may be incorporated in the structures illustrated in FIGS. 4-14.
Figure 17:
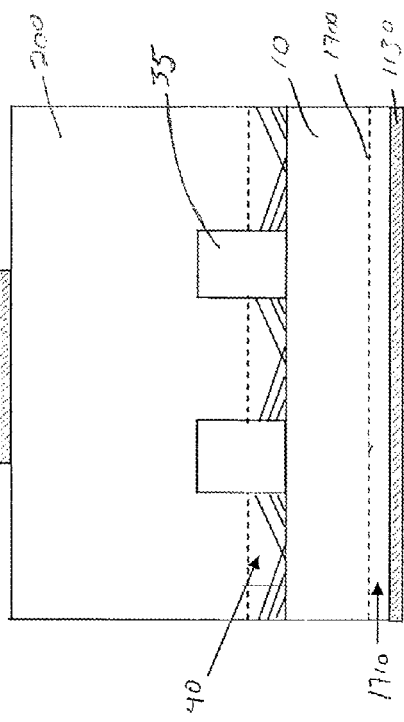
Figure 16:
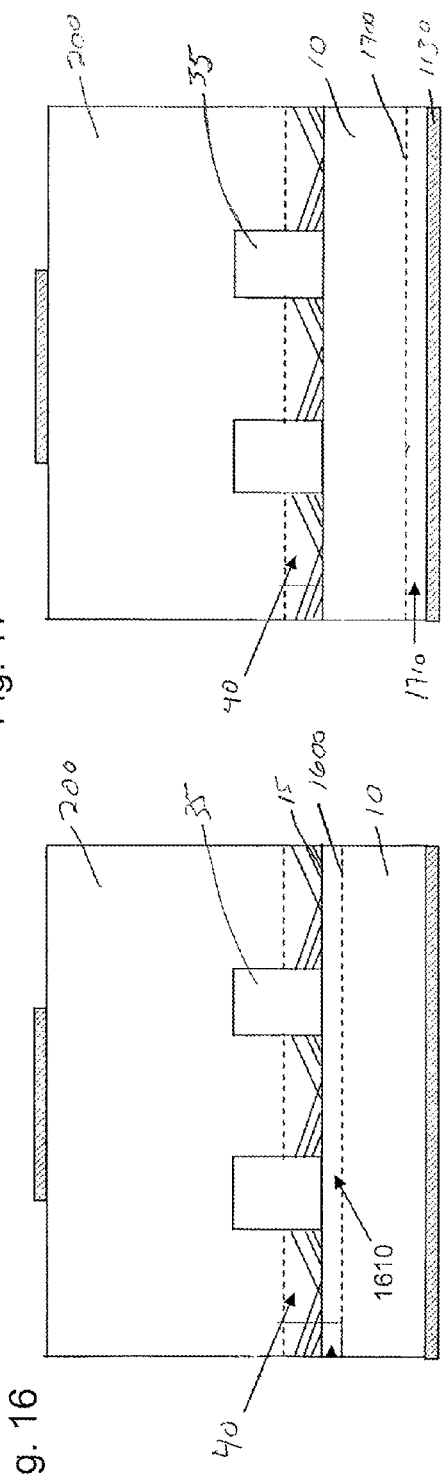

FIGS. 15-17 illustrate features that may be included in various embodiments such as the embodiments of FIGS. 4-7 and 11-14. Referring to FIG. 15, localized n-type Si regions 1500 in a p-Si substrate 10 are formed by thermal annealing after growth of the III-V crystalline material 40 for the PVD cell 200 buffer layer. For example, GaP, GaSb and properly optimized GaAs materials are highly diffusive to Si. They are suitable wetting layers to over-compensate a p-type Si dopant and form p-n junctions at the bottom of trenched areas, e.g., the junctions between the localized n-type Si regions and the p-type substrate. Thus, additional localized p-n junction arrays are made on the Si substrate, which further enhances overall PV cell efficiency without altering the previously described structures. In such embodiments, an active cell junction is disposed below the top surface of the substrate. The shape of the active cell junction may correspond to a shape defined by an intersection of the opening in the mask layer 35 and the top surface 15 of the substrate 10. In some embodiments, p-type Si regions may be formed in an n-Si substrate.

The embodiment illustrated in FIG. 16 includes the formation of a p-n junction 1600 by epitaxially growing a thin film 1610 of n-type Si over a p-type Si substrate 10 before forming mask layer 35. Alternatively, one may grow a film of p-type Si over an n-type Si substrate. Here, an active cell junction, i.e., p-n junction 1600, is disposed below the top surface of the substrate upon which PVDs 200 shall be fabricated, and includes a doped layer, i.e., thin film 1610, proximal to the top surface of the substrate.

Referring to FIG. 17, in another embodiment, a p-n junction 1700 is formed near the bottom surface 1130 of the substrate 10 by diffusing an n-type dopant into a p-type Si substrate to form a doped layer 1710, prior to the formation of mask layer 35. Similarly to FIG. 16, an alternative is to diffuse p-type dopants into an n-type Si substrate. In this embodiment, an active cell junction is disposed below the top surface of the substrate and includes a doped layer 1710 proximal to the bottom surface of the substrate 10.

Figure 18:
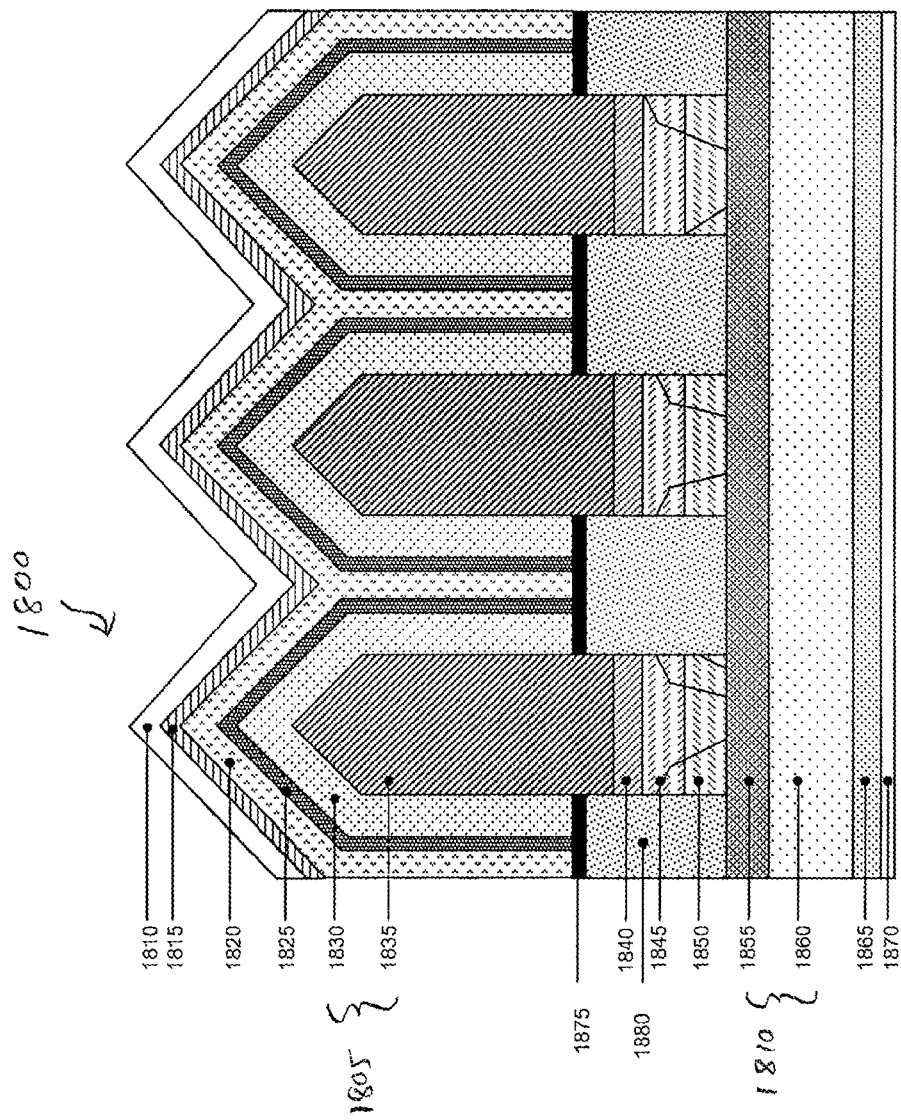
FIGS. 18 and 19 are schematic cross-sectional views illustrating exemplary ART-based dual junction cells.
Figure 19:
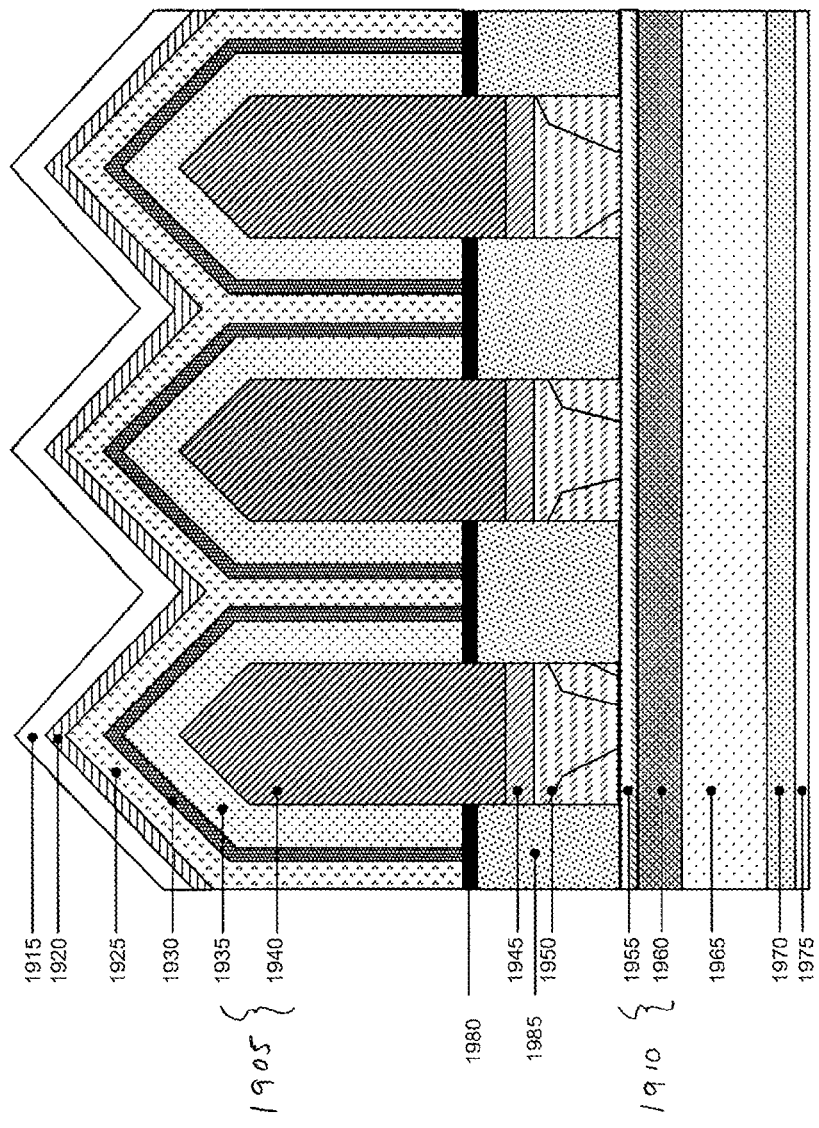

Referring to FIGS. 18 and 19, embodiments of the invention include ART-based dual junction cells. In each of the exemplary dual junction cells, the design of the top cell is de-coupled from the design of the bottom cell so that one may customize the design parameters of each cell without concern for lattice matching. Moreover, the use of ART allows a combination of a Si-based lower cell with a lattice-mismatched III-V-based upper cell.

In addition, the 2-D/3-D structure allows for a fully depleted core/center. For example, in the auto doped structure of FIG. 19, the n-InGaP core 1940 may be fully depleted when covered with a p+ InGaP layer 1935, resulting in improved performance due to higher carrier velocities.

In FIGS. 18 and 19 a bottom region of the crystalline material 40 disposed in the ART opening 30 is heavily doped, which for PVD applications provides an advantage of mitigating potentially negative impact on performance that may arise from recombination of electrons and holes facilitated by the presence of defects. To avoid having depletion zones that encompass the region of trapped defects, appropriate doping levels are preferably used to either keep the depletion regions outside the defect regions or else to reduce the size of the depletion zones in the area of defect regions. In the exemplary structures of FIGS. 18 and 19, the tunnel junctions in or near the regions of trapped defects are heavily doped and create very small depletion zones.

More specifically, referring to FIG. 18, in an embodiment, a dual junction cell 1800 includes an n+/p III-V top cell 1805 with a bandgap of 1.7 eV disposed over an n+/p Si bottom cell 1810 with a bandgap of 1.1 eV. A summary of the components of the dual junction cell 1800, from top to bottom, is as follows:
- 1810—top contact
- 1815, 1820—contact layers—GaAs doped with Si facilitating a low resistance contact from the semiconductor GaAs layer to the top contact layer
- 1825/1840—transition layers
- 1830/1835—top cell 1805
- 1845/1850—tunnel junction
- 1855/1860—bottom cell 1810
- 1865—contact layer
- 1830—bottom contact
- 1875/1880—two layers left from a 3-layer mask/dielectric (top SiOx layer etched away after layer 6 InGaP is grown).

More particularly, the dual junction cell includes, from the top down, the following layers, with an exemplary structure including the indicated particular materials and thicknesses:
- top contact grid 1810, e.g., an Al grid;
- contact layer 1815 formed by ohmic contact doping, e.g., a Si doping spike;
- contact layer 1820 including an n++ ohmic layer, having a thickness selected from a range of 75-1000 nm, e.g., a 500 nm layer of GaAs, n-doped with Se to a level of $6 \times 10^{18}/cm^3$;
- window layer defining a transition layer 1825, having a thickness selected from a range of 20-35 nm, n+ doped and lattice matched to cell layer 5, e.g., a 25 nm layer of AlInP, n-doped with Si to a level of $4 \times 10^{17}/cm^3$;
- n+ polarity layer 1830 defining a first layer of the top cell 1805, composition designed to provide efficiency, with a band gap $E_g$ of 1.7 eV and having a thickness selected from a range of 75-150 nm, e.g., a 100 nm thick layer of GaInP, n-doped with Se to a level of $2 \times 10^{18}/cm^3$;
- p polarity layer 1835, composition designed to provide efficiency, with a band gap $E_g$ of 1.7 eV and having a thickness selected from a range of 500-1000 nm, e.g., a 750 nm layer of GaInP with a bandgap $E_g$ of 1.7 eV, p-doped with Zn to a level of $1.5 \times 10^{17}/cm^3$;
- n+ back surface field layer 1840, lattice matched to cell layer 1835, having a thickness selected form a range of 30-100 nm, e.g., a 50 nm thick layer of GaInP with a bandgap $E_g$ of 1.7 eV, p-doped with Zn to a level of $3 \times 10^{18}/cm^3$;
- p++ layer 1845 lattice matched to n+ back surface field layer 1840, having $E_g=1.7$ eV and having a thickness selected from a range of 100-150 nm, e.g., a 100 nm thick layer of GaAs, p-doped with C to a level of $8 \times 10^{19}/cm^3$;
- n++ layer 1850 lattice matched to layer 1845, having $E_g=1.7$ eV, having a thickness selected from a range of 100-150 nm, e.g., a 100 nm thick layer of GaAs, n-doped with Se to a level of $1 \times 10^{19}/cm^3$;
- n+ Si layer 1855 with an $E_g$ of 1.1 eV doped with, e.g., As;
- p Si layer 1860 with an $E_g$ of 1.1 eV doped with, e.g., B;
- diffused Al:Si layer 1865;
- Al back contact layer 1870;
- SiN$_x$ etch stop layer 1875 having a thickness of, e.g., 100 nm; and
- SiO$_x$ layer 1880 having a thickness of, e.g., 250 nm.

Referring to FIG. 19, in another embodiment, a dual junction cell is autodoped by Si and includes a p+/n III-V top cell 1905 with a bandgap of 1.7 eV disposed over a p+/n Si bottom cell 1910 with a bandgap of 1.1 eV. An advantage of the illustrated auto-doped structure is that using a heavily doped III-V material in the ART region allows one to benefit from Si diffusion in that Si diffusion effectively provides n-type doping Alternatively, if the heavy doping at least mitigates or eliminates potential problems caused by diffusion of Si into the III-V material during processing. A summary of the components of the dual junction cell is as follows:

More particularly, the dual junction cell of FIG. 19 includes, from the top down, the following layers, with an exemplary structure including the indicated particular materials and thicknesses:

top contact grid 1915, e.g., an Al grid;
ohmic contact doping layer 1920;
p++ ohmic contact layer 1925 having a thickness of selected from a range of 75-1000 nm, e.g., a 100 nm thick layer of p++ GaAs;
a p+ window layer 1930 lattice matched to cell layer 5 and having a thickness selected from a range of 20-35 nm, e.g., a layer of p+ InAlGaP having a thickness of 30 nm;
a p+ polarity layer 1935 having a band gap $E_g$ of 1.7 eV and a thickness selected from a range of 75-150 nm, with a composition tailored for efficiency, e.g., a layer of p+ InGaP having a thickness of 50 nm;
an n polarity layer 1940 having a band gap $E_g$ of 1.7 eV and a thickness selected from a range of 500-1000 nm, with a composition tailored for efficiency, e.g., a layer of n InGaP having a thickness of 550 nm (layers 1935, 1940 forming top cell 1905);
a back surface field layer 1945 having a thickness selected from a range of 30-100 nm and lattice matched to cell layer 6, e.g., a layer of n+ InAlGaP having a thickness of 30 nm;
an n++ layer 1950 lattice matched to back surface field layer 1945, having a band gap of $E_g$=1.7 eV and a thickness selected form a range of 250-300 nm, e.g., a layer of n++ GaAs having a thickness of 300 nm;
a p++ doped Si layer 1955 having a thickness selected from a range of 20-30 nm, e.g., 20 nm;
a p+ Si layer 1960 having a band gap $E_g$ of 1.1 eV;
an n Si layer 1965 having a band gap $E_g$ of 1.1 eV;
a diffused Al:Si layer 1970;
an Al back contact layer 1975;
an $SiN_x$ etch stop layer 1980 having a thickness of 100 nm; and
an $SiO_x$ layer 1985 having a thickness of 250 nm.

Figure 20:
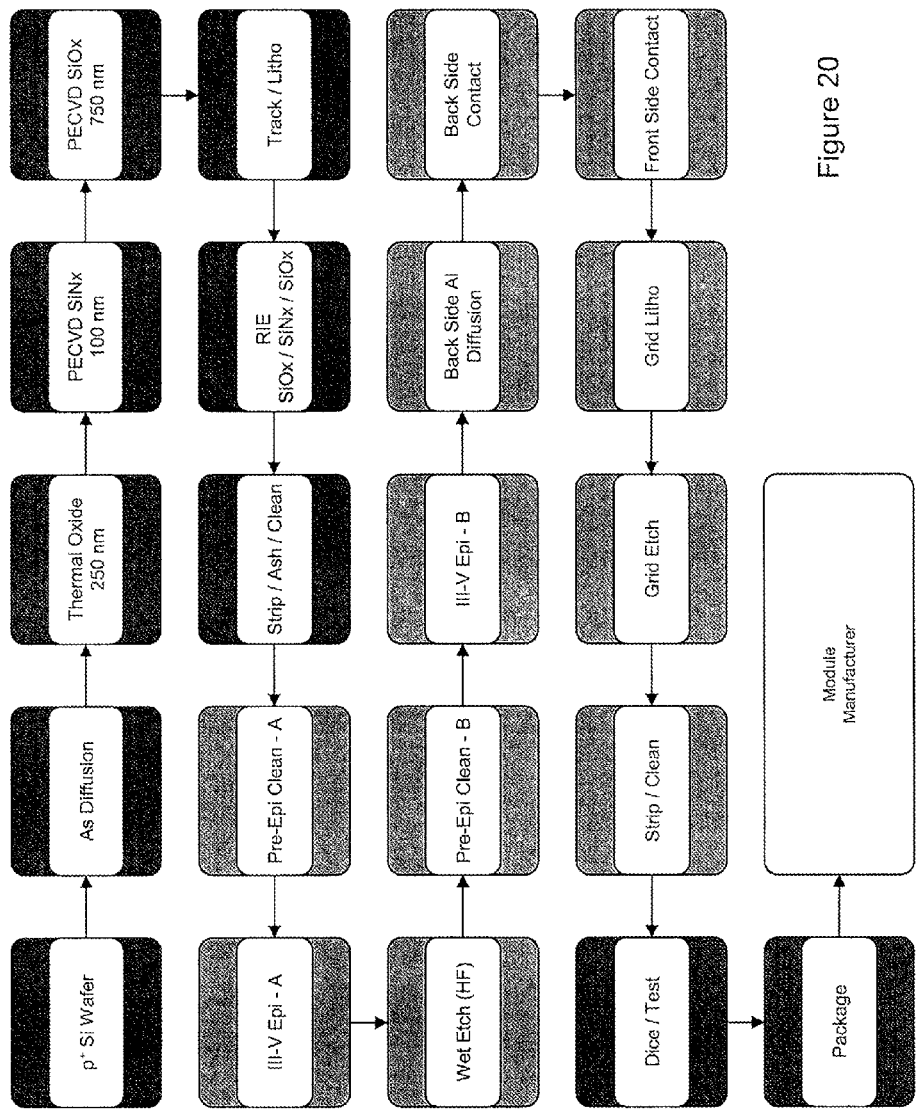
FIG. 20 is a flow chart illustrating a process flow for forming a photovoltaic device by ART.

Referring to FIG. 20, a process flow for forming a PVD by ART is summarized. In a particular embodiment, a starting material is a p+ Si wafer. Arsenic is diffused into the wafer to define an n-type region. A thermal oxide having a thickness of 250 nm is grown over the wafer. PECVD is used to define a mask layer by depositing a 100 nm thick layer of $SiN_x$ and 750 nm of $SiO_x$. Photolithographic and reactive ion etch steps are performed to define windows in the mask layer. The photoresist is removed by a wet strip and dry ash, and the wafer is cleaned. A pre-epitaxial clean is performed, followed by a first III-V epitaxial step to deposit the PVD layers up through the core layer, e.g., layers 1835, 1840, 1845, and 1850 of FIG. 18. A wet etch with HF is performed to remove a portion of the mask layer, i.e., the upper $SiO_x$ portion. A second III-V epitaxial step is performed to deposit the remaining III-V layers over the core layer. A back side Al diffusion defines a back side contact. A front side contact layer is deposited, and a grid is defined by lithography and etch steps. The photoresist is stripped and the wafer cleaned. The wafer is diced into discrete devices and tested. The devices are tested and supplied to a module manufacturer.

Many of the embodiments discussed above describe providing PVDs over monocrystalline Si substrates. Those of skill in the art understand how to substitute other substrate materials. For example, poly-crystalline or amorphous Si substrates may be used as more cost-effective alternatives with suitable efficiency levels for many applications.

Aspects of the embodiments discussed above also provide utility for applications other than PVDs. For example, other device applications such as photonics, e.g., LEDs, can benefit from the ability to create vertically grown heteroepitaxial materials using Si substrates. Inventive aspects of the foregoing embodiments include combinations and variations to implement photovoltaic and other devices comprising a variety of elements.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A structure comprising:
a mask layer disposed above a top surface of a substrate, the mask layer comprising a non-crystalline material and having an opening defined by non-crystalline sidewalls of the mask layer, the opening exposing an area of the top surface of the substrate, the top surface of the substrate comprising a first crystalline material, the area having a width w and a length l, the non-crystalline sidewalls having a height h, wherein the width w is smaller than the length l, and twice the height h is smaller than the length l;
a second crystalline material contacting the first crystalline material in the opening, the second crystalline material being lattice mismatched to the first crystalline material, the second crystalline material having a first region disposed above and proximal to a portion of the top surface of the substrate and having a second region disposed above the first region and above the portion of the top surface of the substrate, no interface comprising a different material being between the first region and the second region in a direction perpendicular to the top surface of the substrate, a majority of defects in the first region of the second crystalline material arising from the lattice mismatch between the first crystalline material and the second crystalline material terminating at the non-crystalline sidewalls;
a photovoltaic cell disposed above the second crystalline material, the photovoltaic cell comprising more than one active cell junctions above the second crystalline material and an active cell junction below the top surface of the substrate, the active cell junction below the top surface of the substrate comprising a doped layer in a bottom surface of the substrate, all portions of the doped layer being separated from the mask layer by a portion of the substrate; and
an electrical contact disposed on the bottom surface of the substrate.

2. The structure of claim 1 wherein the substrate comprises monocrystalline silicon.

3. The structure of claim 2 wherein the monocrystalline silicon comprises (111) silicon.

4. The structure of claim 1 wherein the mask layer comprises at least one of an oxide of silicon or a nitride of silicon.

5. The structure of claim 1 wherein the mask layer comprises a first layer and a second layer, and a chemical composition of the first layer is different from a chemical composition of the second layer.

6. The structure of claim 1 wherein the second crystalline material comprises at least one of a III-V compound, a II-VI compound, or a group IV element or compound.

7. The structure of claim 6 wherein the second crystalline material comprises the III-V compound, and the III-V compound comprises a III-nitride material.

8. The structure of claim 1 wherein the opening defines a generally rectangular shape on the top surface of the substrate.

9. The structure of claim 1 wherein the width is less than or equal to about 1 micrometer.

10. The structure of claim 9 wherein the length is less than about 1 micrometer.

11. The structure of claim 9 wherein the length is greater than about 1 millimeter.

12. The structure of claim 9 wherein the height is less than about 1 micrometer.

13. The structure of claim 9 wherein the height is greater than about 1 micrometer.

14. The structure of claim 9 wherein the width is selected from a range of about 100 nanometers to about 1 micrometer.

15. The structure of claim 14 wherein the length is greater than twice the width.

16. The structure of claim 14 wherein the height is greater than the width.

17. The structure of claim 9 wherein the width is selected from a range of about 10 nanometers to about 50 nanometers.

18. The structure of claim 9 wherein the width is selected from a range of about 50 nanometers to about 100 nanometers.

19. The structure of claim 18 wherein the height is greater than the width.

20. The structure of claim 1, wherein the first region has a height selected from a range of about ½w to 2w and the second region has a height selected from a range of about 1w to 10w.

21. A structure comprising:
a mask layer disposed above a top surface of a substrate, the mask layer comprising a non-crystalline material and having a plurality of openings extending from a top surface of the mask layer to the top surface of the substrate, the top surface of the substrate comprising a first crystalline material, wherein each opening of the plurality of openings is defined by non-crystalline sidewalls having a height h and has a width w and length l along the top surface of the substrate, and the width w is smaller than the length l, and the height is smaller than half the length l;
a second crystalline material disposed in and above the plurality of openings, the second crystalline material contacting the first crystalline material in the plurality of openings, the second crystalline material being lattice mismatched to the first crystalline material, a first portion of the second crystalline material disposed above the openings being substantially exhausted of dislocation defects arising from the lattice mismatch between the first crystalline material and the second crystalline material, a majority of dislocation defects in a second portion of the second crystalline material disposed within the openings and adjacent to the first crystalline material in the top surface of the substrate arising from the lattice mismatch between the first crystalline material and the second crystalline material terminating at the non-crystalline sidewalls, no interface comprising a different material being between the first portion of the second crystalline material and the second portion of the second crystalline material in a direction perpendicular to the top surface of the substrate, the second crystalline material from a first opening of the plurality of openings coalescing over the top surface of the mask layer with the second crystalline material from a second opening of the plurality of openings; and
a photovoltaic cell disposed above the second crystalline material, the photovoltaic cell comprising a first cell over the second crystalline material and a second cell over the first cell, the second cell having a larger band gap than the first cell.

22. The structure of claim 21, wherein the first portion of the second crystalline material has a height selected from a range of about ½w to 2w, and the second portion of the second crystalline material has a height selected from a range of about ½w to 10w.

23. The structure of claim 21, wherein the photovoltaic cell further comprises a third cell below the top surface of the substrate.

24. A structure comprising:
a mask layer disposed above a top surface of a substrate, the mask layer comprising a non-crystalline material and having a plurality of openings extending from a top surface of the mask layer to the top surface of the substrate, the top surface of the substrate comprising a first crystalline material, wherein each opening of the plurality of openings is defined by non-crystalline sidewalls having a height h and has a width w and length l along the top surface of the substrate, and the width w is smaller than the length l, and the height is smaller than half the length l;
a second crystalline material disposed in and above the plurality of openings, the second crystalline material being lattice mismatched to the first crystalline material, a first portion of the second crystalline material disposed above the openings being substantially exhausted of dislocation defects arising from the lattice mismatch between the first crystalline material and the second crystalline material, a majority of dislocation defects in a second portion of the second crystalline material disposed within the openings and adjacent to the first crystalline material in the top surface of the substrate arising from the lattice mismatch between the first crystalline material and the second crystalline material terminating at the non-crystalline sidewalls, no interface comprising a different material being between the first portion of the second crystalline material and the second portion of the second crystalline material in a direction perpendicular to the top surface of the substrate; and
a photovoltaic cell disposed above the second crystalline material, the photovoltaic cell comprising active cell junctions above the second crystalline material, each of the active cell junctions being over one of the plurality of openings and over the top surface of the mask layer, each of the active cell junctions having a top surface and lateral sidewall surfaces.

25. The structure of claim 24, wherein each of the active cell junctions comprise:
- an n-type base layer directly over the second crystalline material, the n-type base layer extending above the top surface of the mask layer; and
- a p-type emitter layer over and contacting the n-type base layer, the p-type emitter layer having a bottom surface contacting the top surface of the mask layer.

* * * * *